United States Patent
Itatani et al.

(10) Patent No.: US 10,460,988 B2
(45) Date of Patent: Oct. 29, 2019

(54) REMOVAL METHOD AND PROCESSING METHOD

(71) Applicant: Tokyo Electron Limited, Tokyo (JP)

(72) Inventors: Takeshi Itatani, Yamanashi (JP); Tadahiro Ishizaka, Yamanashi (JP); Kandabara Tapily, Albany, NY (US); Kai-Hung Yu, Albany, NY (US); Wanjae Park, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 22 days.

(21) Appl. No.: 15/850,458

(22) Filed: Dec. 21, 2017

(65) Prior Publication Data

US 2019/0198390 A1    Jun. 27, 2019

(51) Int. Cl.
*H01L 21/768*  (2006.01)
*H01L 21/311*  (2006.01)
*H01L 21/02*   (2006.01)
*H01L 21/687*  (2006.01)

(52) U.S. Cl.
CPC .... *H01L 21/76865* (2013.01); *H01L 21/0228* (2013.01); *H01L 21/31111* (2013.01); *H01L 21/68714* (2013.01); *H01L 21/76879* (2013.01)

(58) Field of Classification Search
CPC ........... H01L 21/76865; H01L 21/0228; H01L 21/68714; H01L 21/76879; H01L 21/3111
See application file for complete search history.

(56) References Cited

U.S. PATENT DOCUMENTS

| | | | |
|---|---|---|---|
| 2015/0179918 A1* | 6/2015 | Greer | H01L 39/2493 505/329 |
| 2017/0069462 A1* | 3/2017 | Kanarik | H01J 37/321 |

FOREIGN PATENT DOCUMENTS

| | | |
|---|---|---|
| JP | H10-298759 | 11/1998 |
| JP | H11-145282 | 5/1999 |
| JP | H11-186226 | 7/1999 |
| JP | 2003-068705 | 3/2003 |
| JP | 2009-016611 | 1/2009 |
| JP | 2010-206050 | 9/2010 |

* cited by examiner

*Primary Examiner* — Mohammed R Alam
(74) *Attorney, Agent, or Firm* — IPUSA, PLLC

(57) ABSTRACT

A removal method is provided for selectively removing a plurality of types of metal oxide films in a plurality of recesses formed in a substrate that is arranged in a processing chamber. The removal method includes repeatedly performing process steps of exposing the plurality of types of metal oxide films to $BCl_3$ gas or a $BCl_3$ gas plasma generated by introducing $BCl_3$ gas, stopping introduction of the $BCl_3$ gas and performing a purge process, exposing the plurality of types of metal oxide films and/or a plurality of types of metal films underneath the metal oxide films to one or more different plasmas, at least one of which is generated by introducing a single gas of an inert gas, and stopping introduction of the inert gas and performing the purge process.

15 Claims, 12 Drawing Sheets

REMOVAL METHOD AND PROCESSING METHOD

BACKGROUND OF THE INVENTION

1. Field of the Invention

The present invention generally relates to a removal method and a processing method.

2. Description of the Related Art

Techniques are known that involves using a gas containing $BCl_3$ gas to remove a metal oxide film corresponding to a natural oxide film formed on a surface layer of a metal film (see, e.g., Patent Documents 1-6). The natural oxide film formed on the metal film is removed before forming a predetermined film on the metal film for the purpose of reducing contact resistance between the metal film and the predetermined film when the predetermined film is formed.

Note that when metal films in a plurality of holes formed in a substrate are made of a plurality of different metals, different types of natural oxide films are formed on the surface layers of the plurality of types of metal films. For example, in a case where the plurality of types of metal films include a metal film that cannot easily form a natural oxide film on its surface layer and a metal film that can easily form a natural oxide film on its surface layer, the natural oxide film on the metal film that can easily form a natural oxide film on its surface layer has to be selectively etched over the natural oxide film on the metal film that cannot easily form a natural oxide film on its surface layer in order to avoid etching the metal films themselves.

PATENT DOCUMENTS

[Patent Document 1] Japanese Unexamined Patent Application Publication No. 10-298759
[Patent Document 2] Japanese Unexamined Patent Application Publication No. 11-145282
[Patent Document 3] Japanese Unexamined Patent Application Publication No. 11-186226
[Patent Document 4] Japanese Unexamined Patent Application Publication No. 2003-68705
[Patent Document 5] Japanese Unexamined Patent Application Publication No. 2009-16611
[Patent Document 6] Japanese Unexamined Patent Application Publication No. 2010-206050

SUMMARY OF THE INVENTION

In view of the above problems of the related art, one aspect of the present invention is directed to providing a technique for selectively removing a plurality of types of metal oxide films.

According to one embodiment of the present invention, a removal method is provided for selectively removing a plurality of types of metal oxide films in a plurality of recesses that are formed in a substrate arranged in a processing chamber. The removal method includes repeatedly performing process steps of exposing the plurality of types of metal oxide films to $BCl_3$ gas or a $BCl_3$ gas plasma generated by introducing $BCl_3$ gas, stopping introduction of the $BCl_3$ gas and performing a purge process, exposing the plurality of types of metal oxide films and/or a plurality of types of metal films underneath the metal oxide films to a plasma generated by introducing an inert gas, and stopping introduction of the inert gas and performing the purge process. The process step of exposing the plurality of types of metal oxide films and/or the plurality of types of metal films underneath the metal oxide films to the plasma includes exposing the plurality of types of metal oxide films and/or the plurality of types of metal films underneath the metal oxide films to one or more different plasmas generated from a single gas.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

Figure 1:
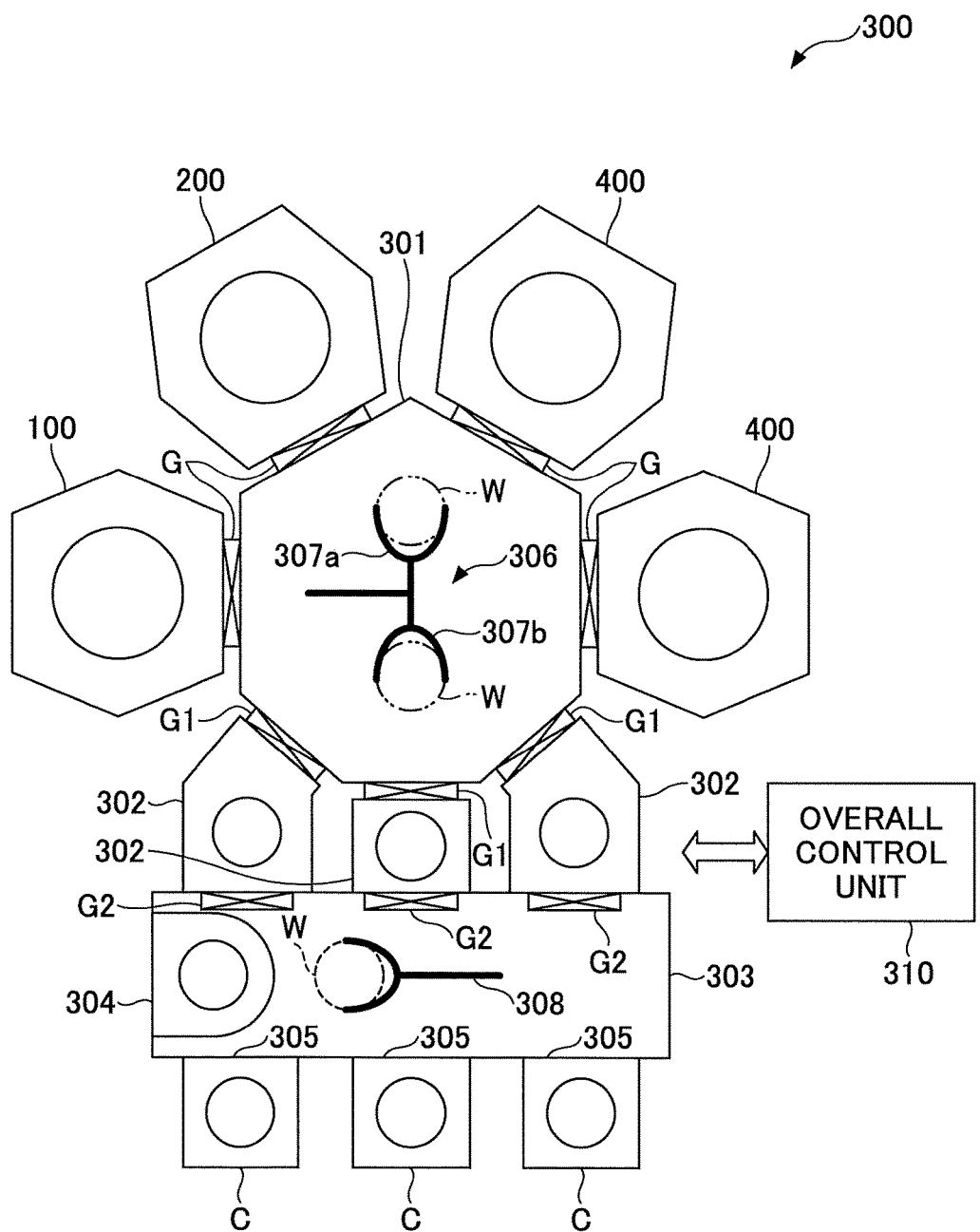
FIG. 1 is a diagram showing a metal wiring forming system.

In the following, embodiments of the present invention will be described with reference to the accompanying drawings. Note that in the following descriptions and the accompanying drawings, elements having substantially the same features are given the same reference numerals and overlapping descriptions thereof may be omitted.

<System Configuration>
[Metal Wiring Forming System]

Figure 2:
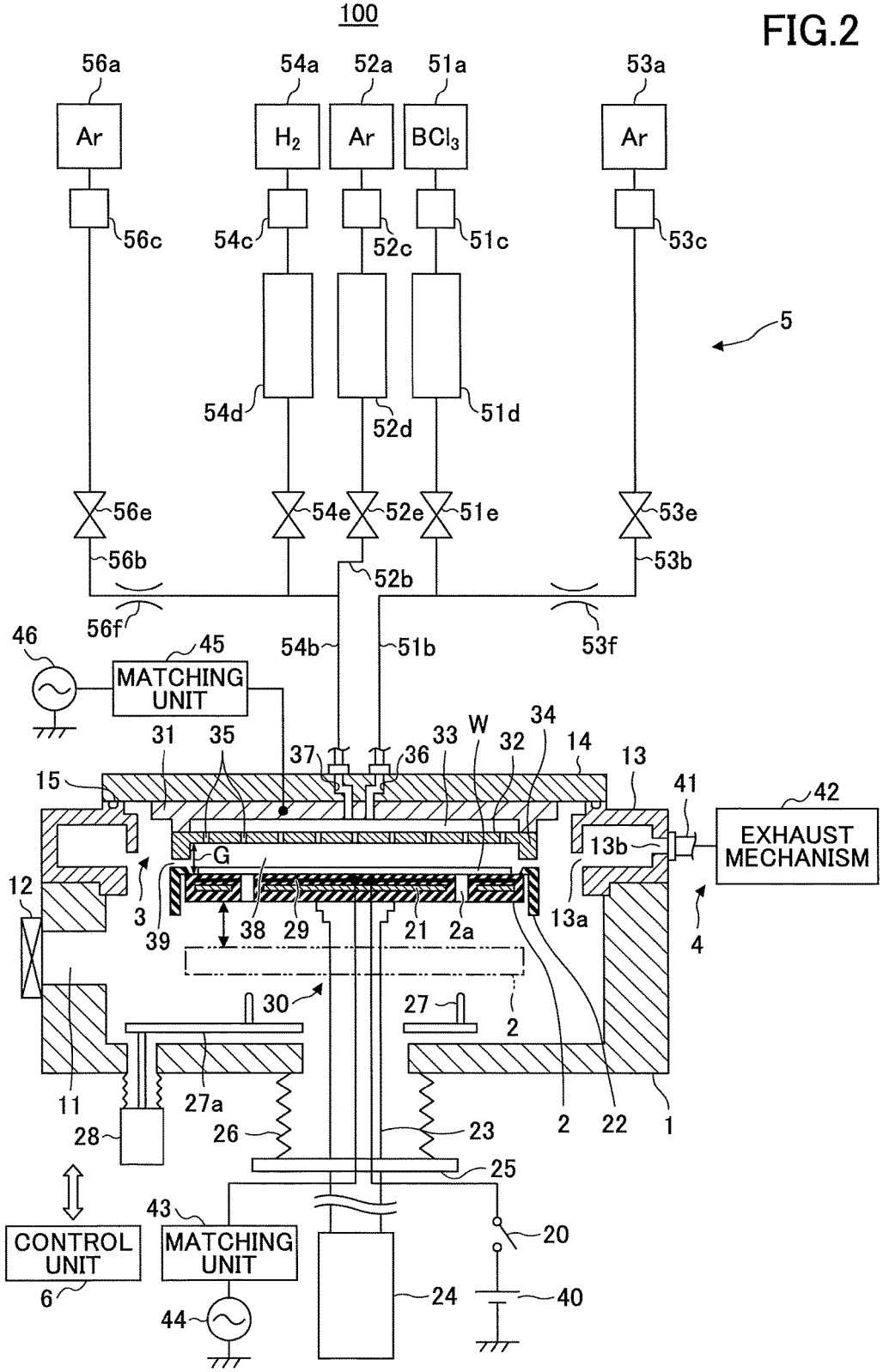
FIG. 2 is a schematic cross-sectional view of a metal oxide film removing apparatus according to an embodiment of the present invention.
Figure 11:
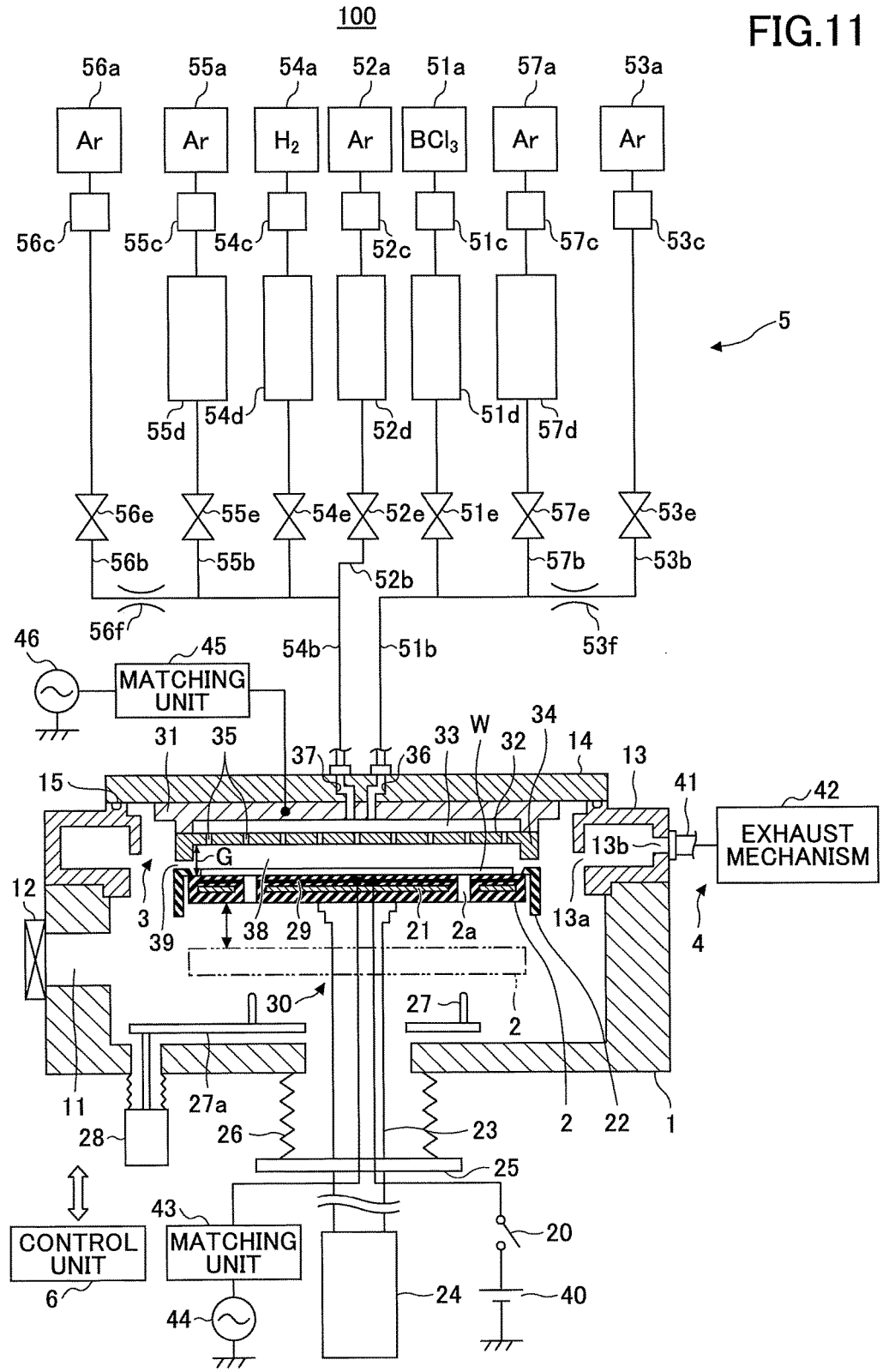
FIG. 11 is a diagram showing an example metal oxide film removing apparatus according to a modified embodiment of the present invention.

Referring to FIG. 1, a metal wiring forming system 300 including a metal oxide film removing apparatus 100 that may have a configuration as shown in FIG. 2 or 11 will be described. FIG. 1 is a schematic horizontal cross-sectional view of the metal wiring forming system 300 according to an embodiment of the present invention.

The metal wiring forming system 300 performs a metal oxide film removal process, and thereafter forms films in a via hole, such as a TaN film as a metal barrier film and a Ru film as a metal wiring, for example.

As shown in FIG. 1, the metal wiring forming system 300 includes one metal oxide film removing apparatus 100, one metal barrier film forming apparatus 200, and two metal wiring forming apparatuses 400. These apparatuses are respectively connected to four wall portions of a vacuum transfer chamber 301 that has a heptagonal planar shape via gate valves G. The interior of the vacuum transfer chamber 301 is evacuated by a vacuum pump and held at a predetermined degree of vacuum. That is, the metal wiring forming system 300 is a multi-chamber type vacuum processing system that can continuously perform metal wiring forming processes without breaking the vacuum. In other words, all processes performed in the processing chambers of the metal oxide film removing apparatus 100, the metal barrier film forming apparatus 200, and the metal wiring forming apparatuses 400 are performed without exposing a silicon wafer W (hereinafter simply referred to as "wafer W") to the atmosphere.

Note that the configuration of the metal oxide film removing apparatus 100 will be described below. The metal barrier film forming apparatus 200 may be an apparatus that performs CVD (Chemical Vapor Deposition) or ALD (Atomic Layer Deposition) in a vacuum atmosphere chamber to form a metal barrier film, such as a TiN film or a TaN film, in a recess formed in the wafer W, for example. The metal wiring forming apparatus 400 may be an apparatus that performs CVD or ALD in a vacuum atmosphere chamber to form a metal wiring, such as a Ru film, on the metal barrier film formed in the recess of the wafer W, for example.

Also, three load lock chambers 302 are connected to the other three wall portions of the vacuum transfer chamber 301 via gate valves G1. An atmospheric transfer chamber 303 is arranged on the opposite side of the load lock chambers 302 to face the vacuum transfer chamber 301. The three load lock chambers 302 are connected to the atmospheric transfer chamber 303 via gate valves G2. The load lock chamber 302 controls the pressure between atmospheric pressure and vacuum when the wafer W is transferred between the atmospheric transfer chamber 303 and the vacuum transfer chamber 301.

Three carrier mounting ports 305 are provided on wall portions of the atmospheric transfer chamber 303 on the opposite side of the wall to which the load lock chambers 302 are connected. Three carriers C (e.g., FOUP: Front Opening Unified Pod) for holding the wafer W are attached to the three carrier mounting ports 305. Also, an alignment chamber 304 for aligning the wafer W is arranged on a sidewall of the atmospheric transfer chamber 303. The atmospheric transfer chamber 303 is configured to have a clean air downflow formed therein.

The vacuum transfer chamber 301 has a transfer mechanism 306 arranged therein. The transfer mechanism 306 transfers the wafer W to the metal oxide film removal apparatus 100, the metal barrier film forming apparatus 200, the metal wiring forming apparatus 400, and the load lock chambers 302. The transfer mechanism 306 includes two transfer arms 307a and 307b that can move independently.

The atmospheric transfer chamber 303 has a transfer mechanism 308 arranged therein. The transfer mechanism 308 is configured to transfer the wafer W to the carriers C, the load lock chambers 302, and the alignment chamber 304.

The metal wiring forming system 300 includes an overall control unit 310. The overall control unit 310 includes a main control unit including a CPU (computer) for controlling various components of the metal oxide film removing apparatus 100, the metal barrier film forming apparatus 200, and the metal wiring forming apparatuses 400; an exhaust mechanism, a gas supply mechanism, and the transfer mechanism 306 of the vacuum transfer chamber 301; exhaust mechanisms and gas supply mechanisms of the load lock chambers 302; the transfer mechanism 308 of the atmospheric transfer chamber 302; and drive systems of the gate valves G, G1, and G2, for example. The overall control unit 310 also includes an input device (e.g., keyboard, mouse), an output device (e.g., printer), a display device (e.g., display), and a storage device (e.g., storage medium). The main control unit of the overall control unit 310 causes the metal wiring forming system 300 to perform a predetermined operation based on a process recipe stored in an internal storage medium of the storage device or a storage device loaded in the storage device, for example. Note that the overall control unit 310 may be an upper-level control unit controlling the control units of various system components, such as the control unit 6 of the metal oxide film removing apparatus 100 described below.

In the following, operations of the metal wiring forming system 300 with the above-described configuration will be described. Note that process operations of the metal wiring forming system 300 described below are executed based on process recipes stored in a storage medium provided in the overall control unit 310.

First, the transfer mechanism 308 is used to take the wafer W out of the carrier C connected to the atmospheric transfer chamber 303 and transfer the wafer W via the alignment chamber 304, and thereafter, the gate valve G2 of one of the load lock chambers 302 is opened and the wafer W is loaded into the load lock chamber 302. After closing the gate valve G2, the interior of the load lock chamber 302 is evacuated.

When the load lock chamber 302 reaches a predetermined degree of vacuum, the gate valve G1 is opened and the wafer W is unloaded from the load lock chamber 302 by one of the transfer arms 307a or 307b of the transfer mechanism 306.

Then, the gate valve G of the metal oxide film removing apparatus 100 is opened, the wafer W held by one of the transfer arms of the transfer mechanism 306 is loaded into the metal oxide film removing apparatus 100, the transfer arm that has unloaded the wafer W is returned to the vacuum transfer chamber 301, and the gate valve G is closed. Then, the metal oxide film removing apparatus 100 performs a metal oxide film removal process on the wafer W.

After the metal oxide film removal process is completed, the gate valve G of the metal oxide film removing apparatus 100 is opened and the wafer W is unloaded from the metal oxide film removing apparatus 100 by one of the transfer arms 307a or 307b of the transfer mechanism 306. Then, the gate valve G of the metal barrier film forming apparatus 200 is opened, the wafer W held by the transfer arm is loaded into the metal barrier film forming apparatus 200, the transfer arm that has unloaded the wafer W is returned to the vacuum transfer chamber 301, and the gate valve G is closed. Then, the metal barrier film forming apparatus 200 performs CVD or ALD to form a metal film, such as a TiN film or a TaN film, as a metal barrier film, in a recess of the wafer W.

After the metal barrier film forming process is completed, the gate valve G of the metal barrier film forming apparatus 200 is opened and the wafer W is unloaded from the metal barrier film forming apparatus 200 by one of the transfer arms 307a or 307b of the transfer mechanism 306. Then, the gate valve G of one of the metal wiring forming apparatuses 400 is opened, the wafer W held by the transfer arm is loaded into the metal wiring forming apparatus 400, the transfer arm that has unloaded the wafer W is returned to the vacuum transfer chamber 301, and the gate valve G is closed. Then, the metal wiring forming apparatus 400 performs CVD or ALD to form a metal wiring, such as a Ru film, on the metal barrier film that has been formed in the recess of the wafer W.

After the metal wiring is formed in the above-described manner, the gate valve G of the metal wiring forming apparatus 400 is opened and the wafer W is unloaded from the metal wiring forming apparatus 400 by one of the transfer arms 307a or 307b of the transfer mechanism 306. Then, the gate valve G1 of one of the load lock chambers 302 is opened and the wafer W held by the transfer arm is loaded into the load lock chamber 302. Then, the interior of the load lock chamber 302 is returned to atmospheric pressure, the gate valve G2 is opened, and the wafer W in the load lock chamber 302 is returned to the carrier C by the transfer mechanism 308.

By concurrently performing the above-described process operations on a plurality of wafers W, metal wiring forming processes may be completed on a predetermined number of wafers W.

By configuring the metal wiring forming system 300 to include the metal oxide film removing apparatus 100, the metal barrier film forming apparatus 200, and two metal wiring forming apparatuses 400 as described above, metal oxide film removal, metal barrier film formation, and metal wiring formation may be implemented at a high throughput. Also, the above sequence of processes may be performed without breaking the vacuum, and as such, oxidation of the wafer W during execution of the processes may be prevented.

[Metal Oxide Film Removing Apparatus]

In the following, the configuration of the metal oxide film removing apparatus 100 will be described with reference to FIG. 2. FIG. 2 is a schematic cross-sectional view of the metal oxide film removing apparatus 100 according to an embodiment of the present invention. The metal oxide film removing apparatus 100 includes a processing chamber 1, a pedestal 2, a shower head 3, an exhaust unit 4, a gas supply mechanism 5, and a control unit 6.

The processing chamber 1 is made of a metal such as aluminum and has a substantially cylindrical shape. A loading/unloading port 11 for loading/unloading the wafer W is formed on a side wall of the processing chamber 1, and the loading/unloading port 11 is opened/closed by the gate valve 12. An annular exhaust duct 13 having a rectangular cross section is arranged above the main structure of the processing chamber 1. The exhaust duct 13 has a slit 13a formed along its inner peripheral face. An exhaust port 13b is formed on an outer wall of the exhaust duct 13. A ceiling wall 14 for sealing the upper opening of the processing chamber 10 is arranged on an upper surface of the exhaust duct 13. Also, a gap between the exhaust duct 13 and the ceiling wall 14 is hermetically sealed by a seal ring 15.

The pedestal 2 holds the wafer W, which is an example of a substrate, horizontally, inside the processing chamber 1. The pedestal 2 is formed into a disk shape having a size corresponding to the size of the wafer W and is supported by a support member 23. The pedestal 2 may be made of a ceramic material, such as aluminum nitride (AlN), or a metal material, such as aluminum or a nickel alloy, for example. The pedestal 2 has a heater 21 and an electrode 29 embedded therein for heating the wafer W. The heater 21 receives power from a heater power supply (not shown) to generate heat. The output of the heater 21 is controlled by a temperature signal of a thermocouple (not shown) provided in the vicinity of the upper surface of the pedestal 2, and in this way, the wafer W is controlled to a predetermined temperature.

A first radio frequency power supply 44 is connected to the electrode 29 via a matching unit 43. The matching unit 43 matches the load impedance with the internal impedance of the first radio frequency power supply 44. The first radio frequency power supply 44 may be configured to apply a radio frequency power of 13.56 MHz, for example, to the pedestal 2 via the electrode 29. In this way, the pedestal 2 also functions as a lower electrode.

Further, the electrode 29 is connected to an adhesion power supply 40 via an on/off switch 20 arranged outside the processing chamber 1 and also functions as an electrode for adhering the wafer W to the pedestal 2.

A second radio frequency power supply 46 is connected to the shower head 3 via a matching unit 45. The matching unit 45 matches the load impedance with the internal impedance of the second radio frequency power supply 46. The second radio frequency power supply 46 may be configured to apply a radio frequency power of 13.56 MHz, for example, to the shower head 3. In this way, the shower head 3 also functions as an upper electrode.

A cover member 22 that may be made of a ceramic material such as alumina is arranged to cover an upper peripheral region and a side face of the pedestal. An adjustment mechanism 30 for adjusting a gap G between the upper electrode (shower head 3) and the lower electrode (pedestal 2) is arranged on a bottom surface of the pedestal 2. The adjustment mechanism 30 includes the support member 23 and a lift mechanism 24. The support member 23 supports the pedestal 2 from the center of the bottom surface of the pedestal 2, penetrates through a hole formed in a bottom wall of the processing chamber 1, and extends below the processing chamber 1 such that its lower end is connected to the lift mechanism 24. The lift mechanism 24 raises/lowers the pedestal 2 via the support member 23. By adjusting the gap G in the above-described manner, the height of the pedestal 2 may be adjusted to have the gap G suitable for the intended process, such as a metal oxide film removal process that involves alternately supplying $BCl_3$ gas and Ar gas (described below) or a cleaning process that uses a plasma generated from a single gas of $H_2$ gas and Ar gas (described below). Also, the adjustment mechanism 30 raises/lowers the lift mechanism 24 to adjust the position of the pedestal 2 between a processing position, as indicated by a solid line in FIG. 2, and a transfer position below the processing position, as indicated by a two-dot-dashed line in FIG. 2, at which the wafer W can be transferred and loaded into or unloaded from the processing chamber 1.

A flange portion 25 is attached to the support member 23 at the lower side of the processing chamber 1. A bellows 26 that partitions the atmosphere inside the processing chamber 1 and the outside air and expands/contracts in accordance with the upward/downward movement of the pedestal 2 is arranged between the bottom surface of the processing chamber 1 and the flange portion 25.

Three wafer support pins 27 (only two are shown) are arranged to protrude upward from a lift plate 27a in the vicinity of the bottom surface of the processing chamber 1. A lift mechanism 28 that is provided below the processing chamber 1 raises/lowers the wafer support pins 27 via the lift plate 27a. The wafer support pins 27 can protrude and retract from the upper surface of the pedestal 2 at the transfer position by being inserted into through holes 2a that are provided in the pedestal 2. By raising and lowering the wafer support pins 27, the wafer W can be transferred between the pedestal 2 and a transfer mechanism.

The shower head 3 supplies processing gas to the processing chamber 1 by showering the processing gas into the processing chamber 1. The shower head 3 is made of a metal, is arranged to face the pedestal 2, and has a diameter substantially equal to the diameter of the pedestal 2. The shower head 3 includes a main body 31 fixed to the ceiling wall 14 of the processing chamber 1 and a shower plate 32 connected below the main body 31. A gas diffusion space 33 is formed between the main body 31 and the shower plate 32. Gas inlet holes 36 and 37 are arranged to penetrate through the ceiling wall 14 of the processing chamber 1 and a center portion of the main body 31 to communicate with the gas diffusion space 33. An annular protrusion 34 protruding downward is formed along a peripheral edge portion of the shower plate 32. Gas discharge holes 35 are formed in a flat surface portion of the shower plate 32 at the inner side of the annular protrusion 34. When the pedestal 2 is positioned at the processing position, a processing space 38 is formed between the pedestal 2 and the shower plate 32, and the upper surface of the cover member 22 and the annular protrusion 34 come close to each other to form an annular gap 39.

The exhaust unit 4 evacuates the interior of the processing chamber 1. The exhaust unit 4 includes an exhaust pipe 41 that is connected to the exhaust port 13b, and an exhaust mechanism 42 including components, such as a vacuum pump and a pressure control valve, connected to the exhaust pipe 41. During execution of a process, gas in the processing chamber 1 reaches the exhaust duct 13 via the slit 13a and is evacuated from the exhaust duct 13 through the exhaust pipe 41 by the exhaust mechanism 42.

The gas supply mechanism 5 supplies processing gas into the processing chamber 1. The gas supply mechanism 5 includes a $BCl_3$ gas supply source 51a, an Ar gas supply source 52a, an Ar gas supply source 53a, an $H_2$ gas supply source 54a, and an Ar gas supply source 56a.

The $BCl_3$ gas supply source 51a supplies $BCl_3$ gas into the processing chamber 1 via a gas supply line 51b. The gas supply line 51b has a flow rate controller 51c, a storage tank 51d, and a valve 51e arranged from the upstream side to the downstream side of the gas supply line 51b. The $BCl_3$ gas supplied from the $BCl_3$ gas supply source 51a is temporarily stored in the storage tank 51d before being supplied into the processing chamber 1. The $BCl_3$ gas is pressurized to a predetermined pressure in the storage tank 51d and then supplied into the processing chamber 1. By temporarily storing the $BCl_3$ gas in the storage tank 51d as described above, the $BCl_3$ gas may be stably supplied into the processing chamber 1 at a relatively high flow rate. The downstream side of the valve 51e of the gas supply line 51b is connected to the gas inlet hole 36. The valve 51e allows/stops the supply of $BCl_3$ gas from the $BCl_3$ gas supply source 51a to the processing chamber 1.

The Ar gas supply source 52a supplies Ar gas into the processing chamber 1 via gas supply lines 52b and 54b. The gas supply line 52b has a flow rate controller 52c, a storage tank 52d, and a valve 52e arranged from the upstream side to the downstream side of the gas supply line 52b. The downstream side of the valve 52e of the gas supply line 52b is connected to the gas supply line 54b. The Ar gas supplied from the Ar gas supply source 52a is temporarily stored in the storage tank 52d before being supplied into the processing chamber 1. The Ar gas is pressurized to a predetermined pressure in the storage tank 52d, and then supplied into the processing chamber 1. By temporarily storing the Ar gas in the storage tank 52d as described above, the Ar gas may be stably supplied into the processing chamber 1 at a relatively high flow rate. The valve 52e allows/stops the supply of Ar gas from the storage tank 52d to the processing chamber 1.

The Ar gas supply source 53a supplies Ar gas, which is used as a carrier gas and a purge gas, into the processing chamber 1 through a gas supply line 53b at all times during processing. The gas supply line 53b has a flow rate controller 53c, a valve 53e, and an orifice 53f arranged from the upstream side to the downstream side of the gas supply line 53b. The downstream side of the orifice 53f of the gas supply line 53b is connected to the gas supply line 51b. The valve 53e allows/stops the supply of Ar gas from the Ar gas supply source 53a to the processing chamber 1. While the storage tank 51a enables gas to be supplied to the gas supply line 51b at a relatively high flow rate, the orifice 53f prevents the gas supplied to the gas supply line 51b from flowing backward to enter the Ar gas supply line 53b.

The $H_2$ gas supply source 54a supplies $H_2$ gas into the processing chamber 1 via a gas supply line 54b. The gas supply line 54b has a flow rate controller 54c, a storage tank 54d, and a valve 54e arranged from the upstream side to the downstream side of the gas supply line 54b. The $H_2$ gas supplied from the $H_2$ gas supply source 54a is temporarily stored in the storage tank 54d before being supplied into the processing chamber 1. The $H_2$ gas is pressurized to a predetermined pressure in the storage tank 54d and then supplied into the processing chamber 1. By temporarily storing the $H_2$ gas in the storage tank 54d as described above, the $H_2$ gas may be stably supplied into the processing chamber 1 at a relatively high flow rate. The downstream side of the valve 54e of the gas supply line 54b is connected to the gas inlet hole 37. The valve 54a allows/stops the supply of the $H_2$ gas from the $H_2$ gas supply source 54a to the processing chamber 1.

The Ar gas supply source 56a supplies Ar gas, which is used as a carrier gas and a purge gas, into the processing chamber 1 via a gas supply line 56b at all times during processing. The gas supply line 56b has a flow rate controller 56c, a valve 56e, and an orifice 56f arranged from the upstream side to the downstream side of the gas supply line 56b. The downstream side of the orifice 56f of the gas supply line 56b is connected to the gas supply line 54b. The valve 56e allows/stops the supply of Ar gas from the Ar gas supply source 56a to the processing chamber 1. While the storage tanks 52d and 54d enable gas to be supplied at a relatively high flow rate to the gas supply lines 52b and 54b, the orifice 56f prevents the gas supplied to the gas supply lines 52b and 54b from flowing backward to enter the Ar gas supply line 56b.

The control unit 6 may be a computer, for example, and includes a CPU (Central Processing Unit), a RAM (Random Access Memory), a ROM (Read Only Memory), and an auxiliary storage device, for example. The CPU operates based on a program stored in the ROM or the auxiliary storage device and controls the operation of the metal oxide film removing device 100. The control unit 6 may be provided inside the metal oxide film removing apparatus 100 or may be provided outside the metal oxide film removing apparatus 100. In the case where the control unit 6 is provided outside the metal oxide film removing apparatus 100, the control unit 6 can control the metal oxide film removing apparatus 100 through wired communication or wireless communication, for example.

[Basic ALE Process]

Figure 3:
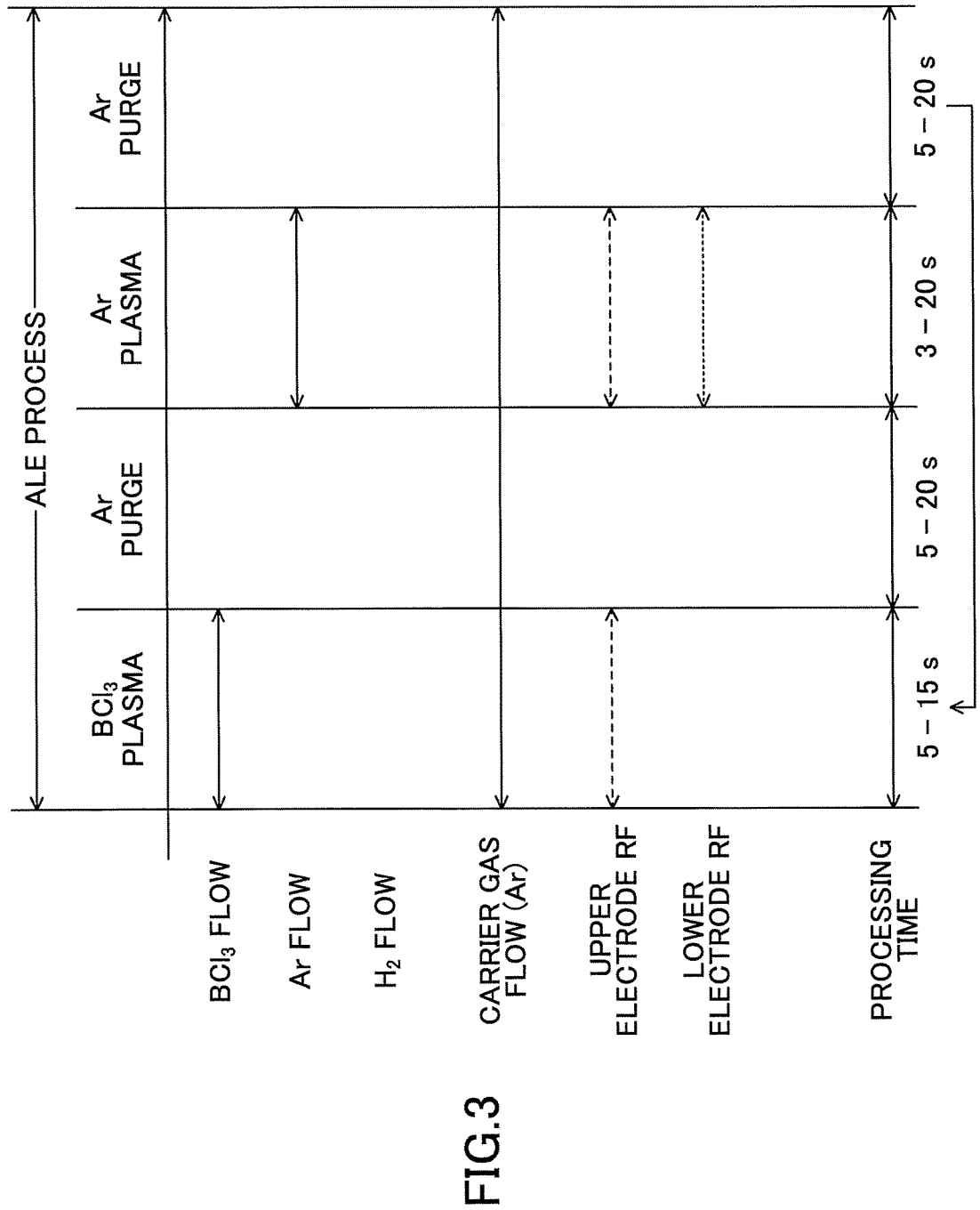
FIG. 3 is a diagram showing an example atomic layer etching process according to an embodiment of the present invention.
Figure 4:
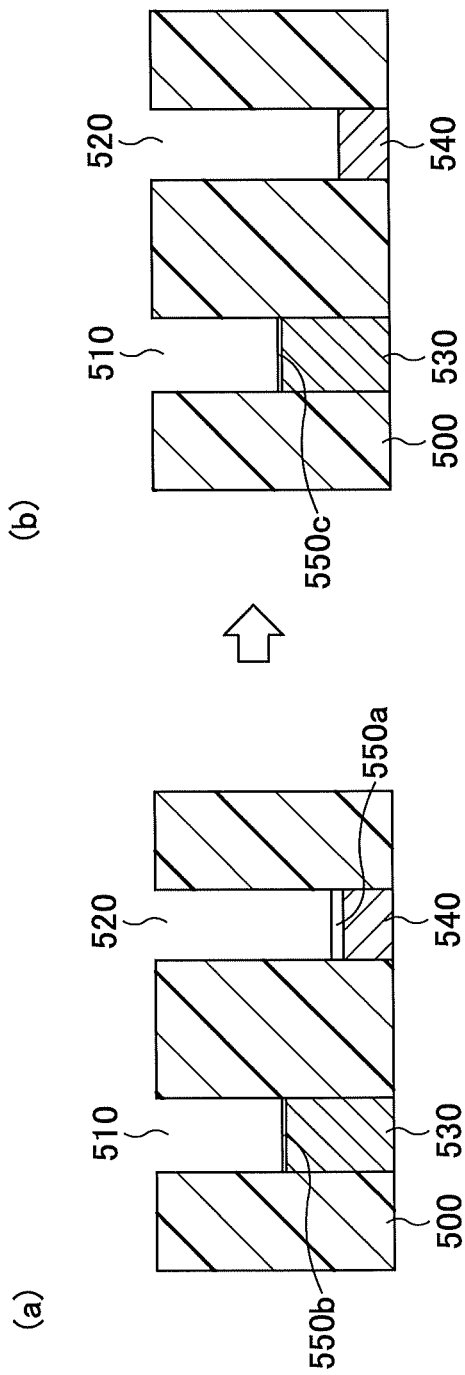
FIG. 4 is a diagram showing an example selective removal process for removing a plurality of types of metal oxide films according to an embodiment of the present invention.

In the following, a basic deposition/atomic layer etching process (hereinafter referred to as "ALE process") performed in the metal oxide film removing apparatus 100 will be described with reference to FIGS. 2, 3 and 4. The ALE process involves alternately performing a $BCl_3$ gas plasma process step and an Ar gas plasma process step, and performing a purge process step in between the plasma process steps. FIG. 3 describes a sequence of process steps of the basic ALE process.

In the $BCl_3$ gas plasma process step ("$BCl_3$ PLASMA"), $BCl_3$ gas is temporarily stored in the storage tank 51d of FIG. 2, and the $BCl_3$ gas that has been pressurized to a predetermined pressure is supplied to the processing chamber 1 by opening the valve 51e. Also, the valves 53e and 56e are opened, and Ar gas that acts as a carrier gas is supplied from the Ar gas supply sources 53a and 56a to the processing chamber 1. Also, the second radio frequency power supply 46 applies radio frequency power to the shower head 3. Further, the heater 21 is used to control the temperature of the lower electrode to a predetermined temperature that has been set up as a process condition.

Also, the $BCl_3$ gas plasma process step is performed under the following process conditions so that $BCl_3$ gas plasma is generated from the $BCl_3$ gas supplied into the processing chamber 1 and the wafer W is exposed to the generated $BCl_3$ gas plasma.

| (Process Conditions) | |
| --- | --- |
| Radio frequency power (upper electrode) | 20-500 W |
| Pressure (processing chamber) | 2-40 Pa (15-300 mT) |
| Temperature (lower electrode) | 20-200° C. |
| Processing time | 5-15 s |

In the above-described $BCl_3$ gas plasma process step, natural oxide films 550a and 550b as shown in FIG. 4(a) are exposed to the $BCl_3$ gas plasma under the above process conditions, and as a result, Cl and B in the $BCl_3$ gas plasma are adsorbed to the natural oxide films 550a and 550b.

In the purge process step ("Ar PURGE") shown in FIG. 3, the valve 51e of FIG. 2 is closed, and the supply of $BCl_3$ gas from the $BCl_3$ gas supply source 51a to the processing chamber 1 is stopped. Because Ar gas is used as a carrier gas as well as a purge gas, the valves 53e and 56e are open at all times during processing (see "CARRIER GAS FLOW" in FIG. 3) and Ar gas continues to be supplied from the Ar gas supply source 53a and the Ar gas supply source 56a to the processing chamber 1. Also, the purge process step is performed under the following process conditions to purge the interior of the processing chamber 1 with Ar gas.

| (Process Conditions) | |
| --- | --- |
| Radio frequency power | Not applied |
| Processing time | 5-20 s |

In the above-described purge process step, the Ar gas that is used as a purge gas purges $BCl_3$ gas remaining in the processing chamber 1 as well as $BCl_3$ gas remaining in the gas supply line 51b at the downstream side of the valve 51e. Also, the Ar gas supplied from the Ar gas supply source 52a is temporarily stored in the storage tank 52d and is pressurized to a predetermined pressure in the storage tank 52d.

In the Ar gas plasma process step ("Ar PLASMA") shown in FIG. 3, the valve 52e of FIG. 2 is opened to supply Ar gas into the processing chamber 1. Further, the first radio frequency power supply 44 applies radio frequency power to the lower electrode, and the second radio frequency power supply 46 applies radio frequency power to the upper electrode.

Also, the Ar gas plasma process step is performed under the following process conditions so that Ar gas plasma is generated in the processing chamber 1 and the wafer W is exposed to the generated Ar gas plasma.

| (Process Conditions) | |
| --- | --- |
| Radio frequency power (upper electrode) | 20-500 W |
| Radio frequency power (lower electrode) | 20-500 W |
| Pressure (processing chamber) | 4-40 Pa (30-300 mT) |
| Temperature (lower electrode) | 20-200° C. |
| Processing time | 3-20 s |

In the above-described Ar gas plasma process step, the natural oxide films 550a and 550b are exposed to the Ar gas plasma under the above process conditions, and as a result, reaction gases of $BCl_3$ adsorbed to the natural oxide film 550a are bombarded and dispersed by Ar ions.

In the purge process step ("Ar PURGE") performed after the Ar gas plasma process step shown in FIG. 3, the valve 52e of FIG. 2 is closed and the supply of Ar gas from the Ar gas supply source 52a to the processing chamber 1 is stopped. Because the valves 53e and 56e are open at all times during processing, Ar gas continues to be supplied from the Ar gas supply source 53a and the Ar gas supply source 56a to the processing chamber 1. Also, the purge process step performed after the Ar gas plasma process step of FIG. 3 is performed under the following process conditions to purge the interior of the processing chamber 1 with Ar gas.

| (Process Conditions) | |
| --- | --- |
| Radio frequency power | Not applied |
| Processing time | 5-20 s |

In the above-described purge process step, the Ar gas that is used as a purge gas removes gas components remaining in the processing chamber 1. By repeating the above-described process steps, the natural oxide film 550a can be selectively removed.

For example, in FIG. 4(a), via holes 510 and 520 as an example of a plurality of recesses are formed in a silicon oxide (SiO$_2$) film 500 on a wafer. The via holes 510 and 520 have different types of metal films formed therein. For example, the metal film 530 in the via hole 510 may be made of cobalt (Co), and the metal film 540 in the via hole 520 may be made of titanium aluminide (TiAl).

The metal film 530 is made of a metal that cannot easily form a natural oxide film on its surface, and the metal film 540 is made of a metal that can easily form a natural oxide film on its surface. Thus, the natural oxide film 550a formed on the metal film 540 has a film thickness greater than that of the natural oxide film 550b formed on the metal film 530.

By implementing the ALE process that involves repeatedly performing the above-described process steps with respect to the natural oxide films 550a and 550b formed on the surface layers of the metal films 530 and 540, as shown in FIG. 4(b), the natural oxide film 550a formed on the metal film 540, which can easily form a natural oxide film on its surface layer, can be selectively etched over the natural oxide film 550b formed on the metal film 530, which cannot easily form a natural oxide film on its surface layer. Note that a metal may be classified as a metal that can easily form an oxide layer or a metal that cannot easily form an oxide layer based on whether the metal is easily reduced by H$_2$ or the change in Gibbs free energy, for example. Also, note that a metal chloride film 550c is formed on the metal film 530 as described below.

[ALE Process According to Present Embodiment]

Figure 5:
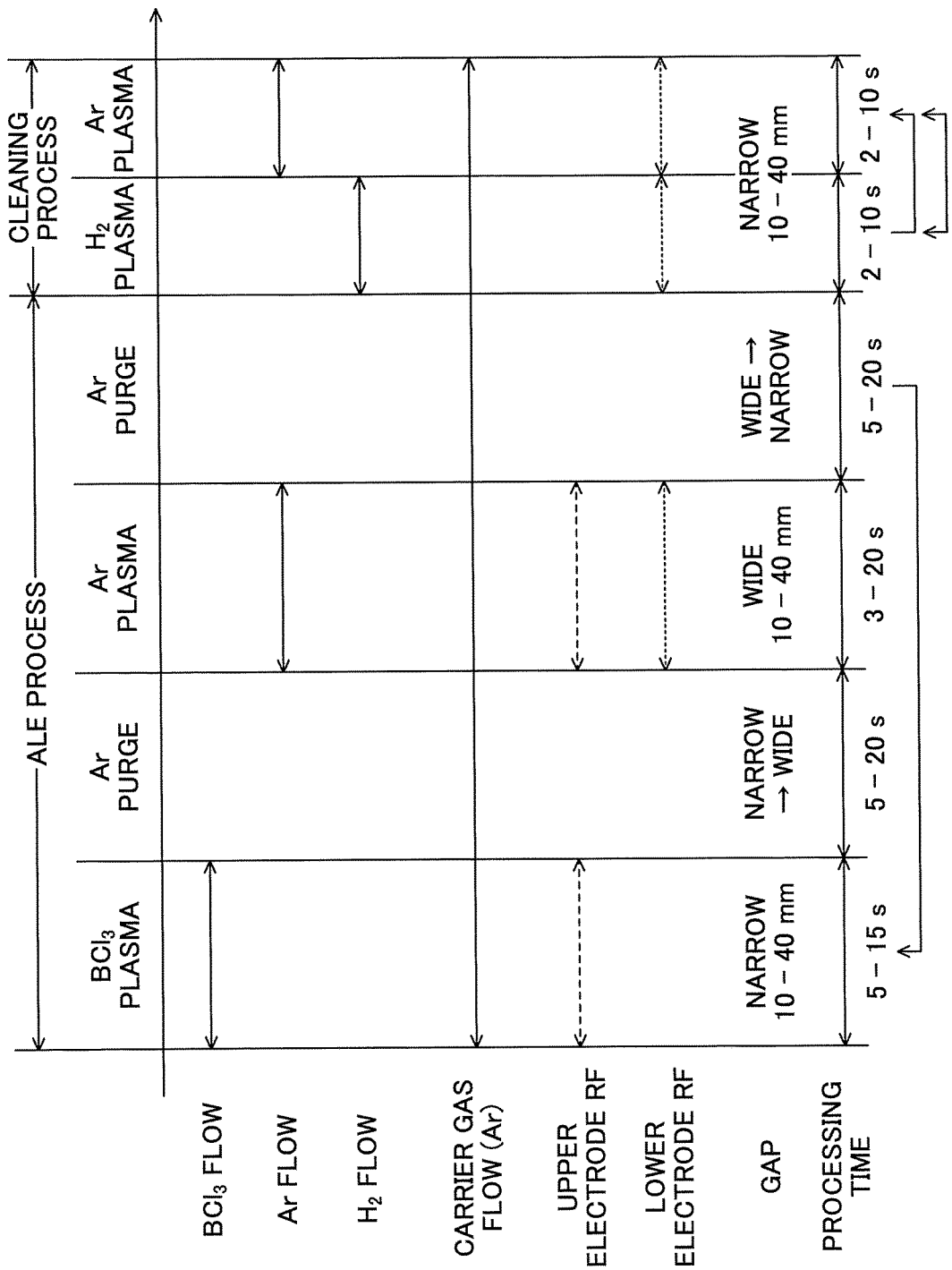
FIG. 5 is a timing chart showing an example selective removal process (including a cleaning process) for removing a plurality of types of metal oxide films according to an embodiment of the present invention.

In the following, an ALE process according to the present embodiment that is executed in the metal oxide film removing apparatus 100 will be described with reference to FIGS. 2, 5, 6, and 7. FIG. 5 describes a process sequence of the ALE process according to the present embodiment.

In the BCl$_3$ gas plasma process ("BCl$_3$ PLASMA") shown in FIG. 5, BCl$_3$ gas that has been temporarily stored in the storage tank 51d of FIG. 2 and has been pressurized to a predetermined pressure is supplied to the processing chamber 1 by opening the valve 51e. Also, the valves 53e and 56e are opened, and Ar gas that acts as a carrier gas is supplied from the Ar gas supply sources 53a and 56a to the processing chamber 1. Also, the second radio frequency power supply 46 applies radio frequency power to the shower head 3. Further, the heater 21 is used to control the temperature of the lower electrode to a predetermined temperature that has been set up as a process condition.

Also, the BCl$_3$ gas plasma process step is performed under the following process conditions so that BCl$_3$ gas plasma is generated from the BCl$_3$ gas supplied into the processing chamber 1 and the wafer W is exposed to the generated BCl$_3$ gas plasma.

(Process Conditions)

| | |
|---|---|
| Radio frequency power (upper electrode) | 20-500 W |
| Pressure (processing chamber) | 2-40 Pa (15-300 mT) |
| Temperature (lower electrode) | 20-200° C. |
| Processing time | 5-15 s |
| Gap G | 10-40 mm |

In the present BCl$_3$ gas plasma process step, the natural oxide films 550a and 550b are exposed to the BCl$_3$ gas plasma under the above process conditions, and as a result, Cl and B in the BCl$_3$ gas plasma are adsorbed to the natural oxide films 550a and 550b. FIG. 7(a) illustrates a state in which Cl and B corresponding to reaction gases of BCl$_3$ are adsorbed to the natural oxide film 550a.

Also, in the present BCl$_3$ gas plasma process step, the adjustment mechanism 30 adjusts the gap G to be 10-40 mm.

In the purge process step ("Ar PURGE") shown in FIG. 5, the valve 51e of FIG. 2 is closed, and the supply of BCl$_3$ gas from the BCl$_3$ gas supply source 51a to the processing chamber 1 is stopped. Because Ar gas is used as a carrier gas as well as a purge gas, the valves 53e and 56e are open at all times during processing (see "CARRIER GAS FLOW" in FIG. 5) and Ar gas continues to be supplied from the Ar gas supply source 53a and the Ar gas supply source 56a to the processing chamber 1. Also, the purge process step is performed under the following process conditions to purge the interior of the processing chamber 1 with Ar gas.

(Process Conditions)

| | |
|---|---|
| Radio frequency power | Not applied |
| Processing time | 5-20 s |

In the present purge process step, the Ar gas that is used as a purge gas purges BCl$_3$ gas remaining in the processing chamber 1 as well as BCl$_3$ gas remaining in the gas supply line 51b at the downstream side of the valve 51e. Also, the Ar gas supplied from the Ar gas supply source 52a is temporarily stored in the storage tank 52d and is pressurized to a predetermined pressure in the storage tank 52d. FIG. 7(b) illustrates a state in which the BCl$_3$ gas other than the reaction gasses adsorbed to the natural oxide film 550a have been purged.

Also, in the present purge process step, the adjustment mechanism 30 lowers the lift mechanism 24 to adjust the gap G to be wider than that during the previous process step (BCl$_3$ gas plasma process step) as preparation for the next process step. By adjusting the gap G in the present purge process step, the next process step can be promptly performed.

In the Ar gas plasma process step ("Ar PLASMA") shown in FIG. 5, the valve 52e of FIG. 2 is opened to supply Ar gas into the processing chamber 1. Further, the first radio frequency power supply 44 applies radio frequency power to the lower electrode, and the second radio frequency power supply 46 applies radio frequency power to the upper electrode.

Also, the Ar gas plasma process step is performed under the following process conditions so that Ar gas plasma is generated in the processing chamber 1 and the wafer W is exposed to the generated Ar gas plasma.

(Process Conditions)

| | |
|---|---|
| Radio frequency power (upper electrode) | 20-500 W |
| Radio frequency power (lower electrode) | 20-500 W |
| Pressure (processing chamber) | 4-40 Pa (30-300 mT) |
| Temperature (lower electrode) | 20-200° C. |
| Processing time | 3-20 s |
| Gap G | 10-40 mm |

In the above-described Ar gas plasma process step, the natural oxide films 550a and 550b are exposed to the Ar gas plasma under the above process conditions, and as a result, reaction gases of BCl$_3$ that are adsorbed to the natural oxide film 550a are bombarded by Ar ions. In this way, as shown in FIG. 7(c), reaction byproducts derived from the reaction with $BCl_3$ are detached from the natural oxide film 550a, and the natural oxide film 550a is selectively etched. The reaction byproducts may be $TiAlO_x$, for example.

Also, in the present Ar gas plasma process step, the adjustment mechanism 30 adjusts the gap G to be wider than the gap G during the $BCl_3$ gas plasma process, within the range of 10-40 mm. The gap G during the Ar gas plasma process step is adjusted to be wider than the gap G during the $BCl_3$ gas plasma process in order to enable chemical desorption of only the reaction byproducts generated by the adsorption of $BCl_3$ gas on metal without causing Ar ions to physically damage a via hole structure formed on the wafer.

In the purge process step ("Ar PURGE") performed after the Ar gas plasma process step shown in FIG. 5, the valve 52e of FIG. 2 is closed and the supply of Ar gas from the Ar gas supply source 52a to the processing chamber 1 is stopped. Because the valves 53e and 56e are open at all times during processing, Ar gas continues to be supplied from the Ar gas supply source 53a and the Ar gas supply source 56a to the processing chamber 1. Also, the purge process step performed after the Ar gas plasma process step of FIG. 5 is performed under the following process conditions to purge the interior of the processing chamber 1 with Ar gas.

| (Process Conditions) | |
|---|---|
| Radio frequency power | Not applied |
| Processing time | 5-20 s |

In the above-described purge process step, the Ar gas that is used as a purge gas removes gas components remaining in the processing chamber 1. FIG. 7(d) shows a state in which $BCl_3$ and byproducts have been purged.

Also, in the present purge process step, the adjustment mechanism 30 drives the lift mechanism 24 as preparation for the next process step. In one embodiment, the adjustment mechanism 30 may raise the lift mechanism 24 to adjust the gap G to be narrower than that during the previous Ar gas plasma process. By adjusting the gap G in the present process step, the next process step may be promptly performed.

[Metal Oxide Film Removal Process]

Figure 6:
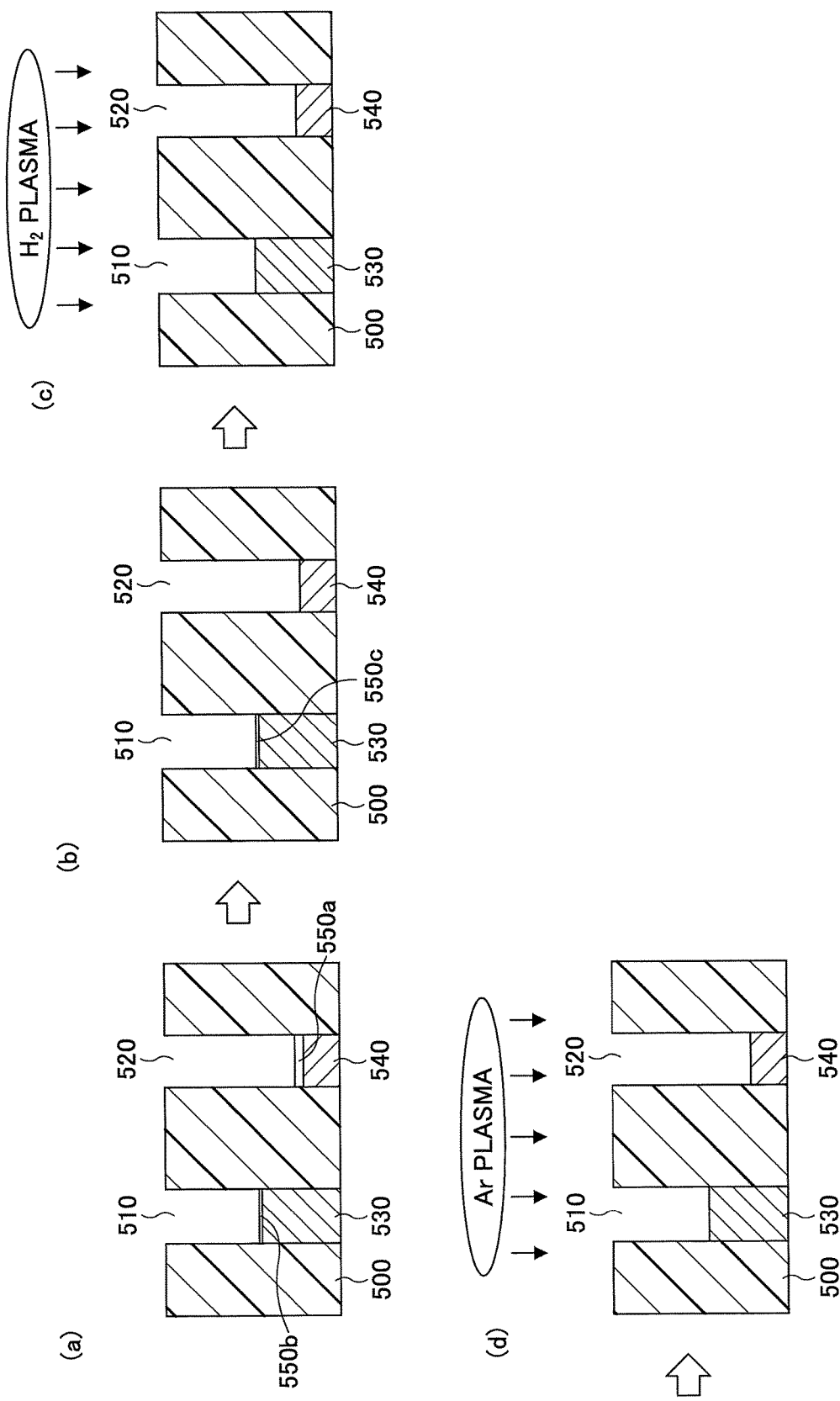
FIG. 6 is a diagram showing an example selective removal process (including a cleaning process) for removing a plurality of types of metal oxide films according to an embodiment of the present invention.
Figure 7:
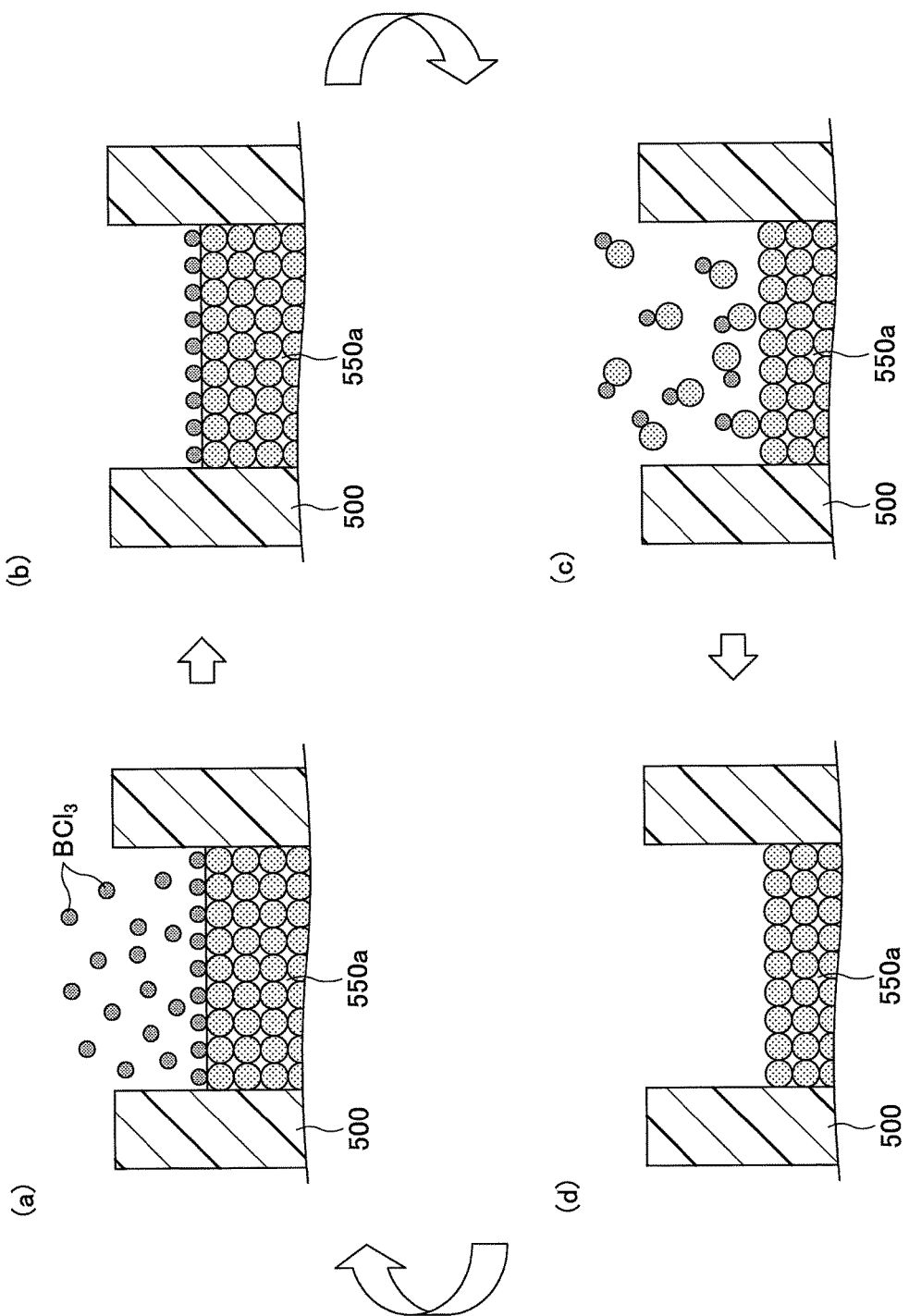
FIG. 7 is a diagram showing an example atomic layer etching process according to an embodiment of the present invention.

In the following, a metal oxide film removal process performed by the metal wiring forming system 300 will be described with reference to FIG. 6. FIG. 6 is a diagram showing an example selective removal process for removing a plurality of types of metal oxide films according to the present embodiment.

Referring to FIG. 6(a), via holes 510 and 520 as an example of a plurality of recesses are formed in the silicon oxide film 500 formed on a wafer. Metal films in the via holes 510 and 520 are made of different types of metal. For example, the metal film 530 in the via hole 510 may be made of Co, and the metal film 540 in the via hole 520 may be made of TiAl.

The natural oxide films 550a and 550b on the surface layers of the metal films 530 and 540 shown in FIG. 6 (a) are removed by performing an ALE process that involves alternately supplying $BCl_3$ gas or $BCl_3$ gas plasma and Ar gas plasma to the natural oxide films 550a and 550b.

Note that the cycle of the ALE process (supplying $BCl_3$ plasma→purge→etching by Ar gas plasma→purge) is repeated a plurality of times. In this way, as shown in FIG. 6(b), the natural oxide film 550a on the metal film 540 that can easily form a natural oxide film on its surface layer can be selectively etched over the natural oxide film 550b on the metal film 530 that cannot easily form a natural oxide film on its surface layer.

The natural oxide film 550b formed on the metal film 530 is removed in the same manner as the natural oxide film 550a by the ALE process. As a result, the $BCl_3$ gas reaches the surface layer of the metal film 530 that corresponds to a base layer, and the metal film 530 reacts with the $BCl_3$ gas to form a metal chloride film 550c (see FIG. 8). The metal chloride film 550c protects the metal film 530. As a result, after the natural oxide film 550b is removed, the metal film 530 will not be etched, and the natural oxide film 550a on the metal film 540 will be selectively etched. Note that the metal chloride constituting the metal chloride film 550c may be $CoCl_x$, for example.

Figure 9:
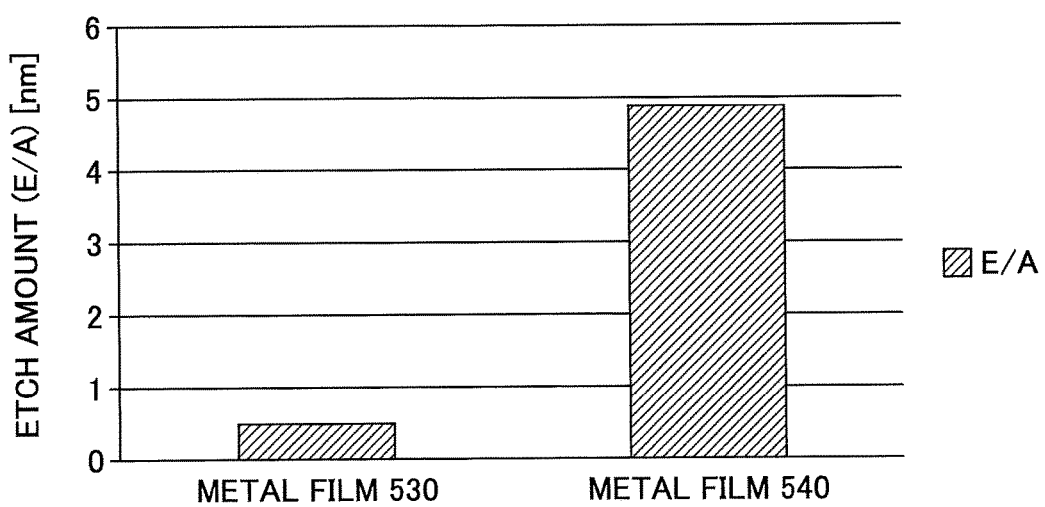
FIG. 9 is a diagram describing a cleaning process after the atomic layer etching process according to an embodiment of the present invention.

FIG. 9 is a graph showing example analysis results of TEM (transmission electron microscopy) cross-sectional analyses performed on the metal film 530 and the metal film 540 after repeating the cycle of the above ALE process 16 times. It can be appreciated from these analysis results that the etch amount (E/A) of the metal film 530 after the ALE process is substantially smaller as compared with the etch amount of the metal film 540. Note that although the ALE process cycle is repeated 16 times in the above-described embodiment, the number of repetitions is not limited to the above embodiment.

Figure 8:
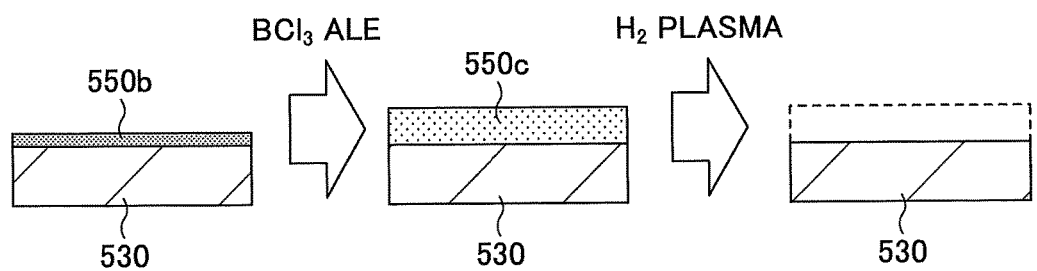
FIG. 8 is a diagram showing an example effect of the atomic layer etching process according to an embodiment of the present invention.

After performing the ALE process, as shown in FIG. 6(c) and FIG. 8, the metal films 530 and 540 are exposed to $H_2$ gas plasma generated from a single gas of hydrogen ($H_2$) gas so that Cl on the metal films 530 and 540 are removed. Then, as shown in FIG. 6(d), the metal films 530 and 540 are exposed to Ar gas plasma generated from a single gas of Ar gas so that B on the metal films 530 and 540 are removed. A cleaning process performed after the ALE process will be described below.

[Cleaning Process after ALE Process]

The cleaning process includes a $H_2$ gas plasma process step and an Ar gas plasma process step. In the $H_2$ gas plasma process step, metal chloride formed on the surface layer of the metal film 530 and Cl residue on the metal films 530 and 540 are removed by a reduction process promoted by $H_2$ gas plasma. In this process step, the valve 54e of FIG. 2 is opened and $H_2$ gas is supplied from the $H_2$ gas supply source 54a into the processing chamber 1. Further, the first radio frequency power supply 44 applies radio frequency power to the lower electrode. The radio frequency power may be applied continuously or intermittently (in pulses).

The $H_2$ gas plasma process step of the cleaning process as shown in FIG. 5 is performed under the following process conditions so that plasma of a single gas of $H_2$ gas is generated and the wafer W is exposed to the generated $H_2$ gas plasma.

| (Process Conditions) | |
|---|---|
| Radio frequency power (lower electrode) | 50-500 W |
| Pressure (processing chamber) | 4-40 Pa (30-300 mT) |
| Temperature (lower electrode) | 20-200° C. |
| Processing time | 2-10 s |
| Gap G | 10-40 mm |

In the present process step, the metal films 530 and 540 are exposed to $H_2$ gas plasma under the above process conditions so that metal chloride formed on the surface layer of the metal film 530 and Cl residue on the metal films 530 and 540 can be removed by a reduction process promoted by the $H_2$ gas plasma.

Note that the gap G during the present process step is preferably adjusted to be narrower than the gap G during the Ar gas plasma process step of the ALE process. Also, the radio frequency power applied to the lower electrode in the present process step is preferably higher than the radio frequency power applied to the lower electrode in the Ar gas plasma process step of the ALE process.

In the subsequent Ar gas plasma process, B residues on the metal films 530 and 540 are removed. In the present process step, the valve 54e in FIG. 2 is closed so that the supply of $H_2$ gas from the $H_2$ gas supply source 54a to the processing chamber 1 is stopped, and the valve 52e is opened so that Ar gas is supplied from the Ar gas supply source 52a into the processing chamber 1. Also, the first radio frequency power supply 44 continues to apply radio frequency power to the lower electrode.

The Ar gas plasma process step of the cleaning process as shown in FIG. 5 is performed under the following process conditions so that plasma of a single gas of Ar gas is generated and the wafer W is exposed to the generated Ar gas plasma.

| (Process Conditions) | |
|---|---|
| Radio frequency power (lower electrode) | 50-500 W |
| Pressure (processing chamber) | 0.13-4 Pa (1-30 mT) |
| Temperature (lower electrode) | 20-200° C. |
| Processing time | 2-10 s |
| Gap G | 10-40 mm |

The gap G during the present process step may be the same as that during the $H_2$ gas plasma process step of the cleaning process and is preferably narrower than the gap G during the Ar gas plasma process step of the ALE process. Also, the radio frequency power applied to the lower electrode during the present process step is preferably higher than the radio frequency power applied to the lower electrode during the Ar gas plasma process step of the ALE process.

In the present process step, the metal films 530 and 540 are exposed to the Ar gas plasma under the above process conditions so that B on the metal films 530 and 540 can be detached by the Ar gas plasma and B residue can be reduced.

Figure 10:
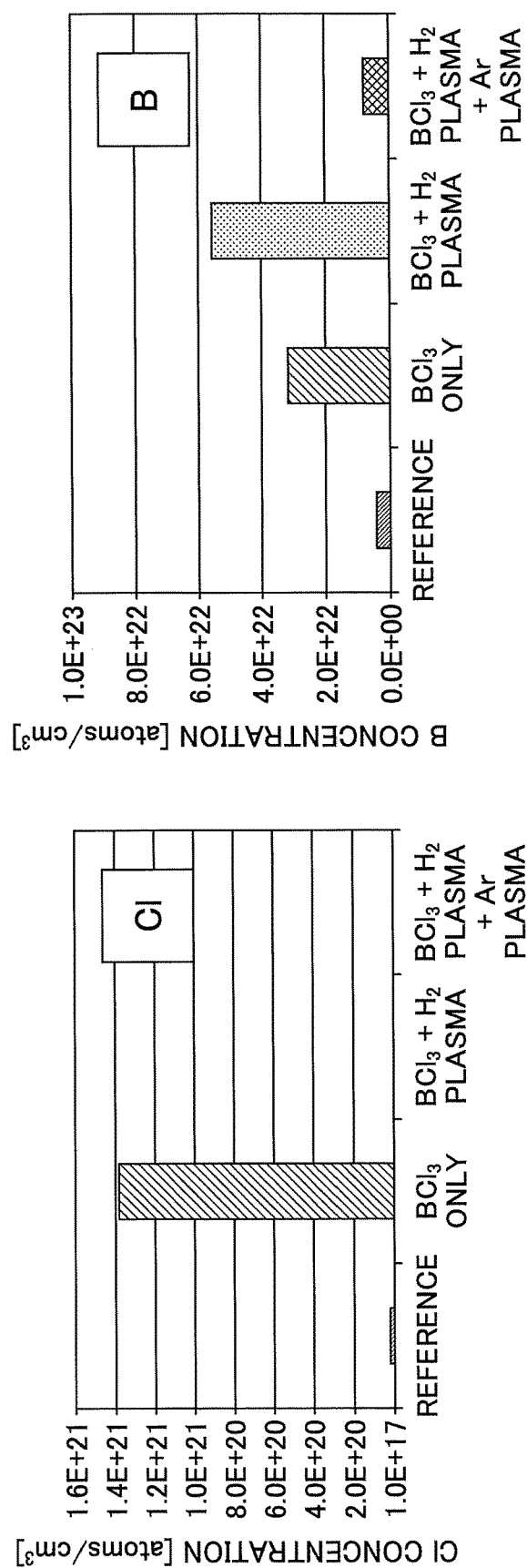
FIG. 10 is a diagram showing example effects of the cleaning process according to an embodiment of the present invention.

FIG. 10 shows graphs representing example effects of the cleaning process. Note that the bars identified as "REFERENCE" on the horizontal axes of the left and right graphs of FIG. 10 represent results of SIMS (secondary ion mass spectrometry) analyses performed on the metal films 530 and 540 with the natural oxide films 550a and 550b formed thereon in a state where no process has yet been performed on the metal films 530 and 540. The bars identified as "$BCl_3$ ONLY" represent results of SIM analyses performed on the metal films 530 and 540 in a state where only the ALE process of alternately supplying $BCl_3$ gas and Ar gas has been performed on the metal films 530 and 540. The bars identified as "$BCl_3+H_2$ PLASMA" represent results of SIM analyses performed on the metal films 530 and 540 in a state where the $H_2$ gas plasma process step of the cleaning process has been performed on the metal films 530 and 540 after the ALE process. The bars identified as "$BCl_3+H_2$ PLASMA+ Ar PLASMA" represent results of SIM analyses performed on the metal films 530 and 540 in a state where the $H_2$ gas plasma process step, followed by the Ar gas plasma process step of the cleaning process have been performed on the metal films 530 and 540 after the ALE process.

The vertical axis of the left graph of FIG. 10 represents the concentration of Cl on the metal films 530 and 540, and the vertical axis of the right graph of FIG. 10 represents the concentration of B on the metal films 530 and 540. As can be appreciated from the left graph of FIG. 10, Cl remaining on the metal films 530 and 540 after the ALE process can be removed by the reduction process promoted by the $H_2$ gas plasma in the $H_2$ gas plasma process step of the cleaning process.

On the other hand, as can be appreciated from the right graph of FIG. 10, B remaining on the metal films 530 and 540 after the ALE process cannot be removed even when the $H_2$ gas plasma process step of the cleaning process is performed, but B residues can be reduced by performing the Ar gas plasma process step of the cleaning process.

As described above, in the removal method according to the present embodiment for selectively removing a plurality of types of metal oxide films in a plurality of recesses formed in the wafer W, a cleaning process is performed after the ALE process of alternately supplying $BCl_3$ gas and Ar gas, and in the cleaning process, the metal films 530 and 540 are cleaned by $H_2$ plasma, followed by Ar plasma. As a result, the natural oxide films formed on the metal films 530 and 540 may be removed, and Cl and B residues on the metal films 530 and 540 may be removed. In this way, contact resistance between the metal films corresponding to base layers and a metal barrier film and a metal wiring to be subsequently formed on the metal films can be reduced.

According to the present embodiment, process steps of exposing the plurality of types of natural oxide films 550a and 550b or the plurality of types of metal films 530 and 540 underneath the natural oxide films to plasma includes a step of exposing the plurality of types of natural oxide films 550a and 550b to one plasma generated from a single gas of an inert gas (hereinafter also referred to as "first process step") and a step of exposing the plurality of types of metal films 530 and 540 to two plasmas each generated from a single gas selected from one of a plurality of types of gases including an inert gas (hereinafter also referred to as "second process step"). One example of the first process step is the Ar gas plasma process step of the ALE process of FIG. 5. The inert gas that can be used in the first process step is not limited to Ar gas. For example, $N_2$ gas may also be used as the inert gas.

An example of the second process step is the $H_2$ gas plasma process step and the Ar gas plasma process step of the cleaning process of FIG. 5. The gases that can be used in the second process step are $H_2$ gas and Ar gas. After exposing the metal films 530 and 540 to a plasma generated from a single gas of $H_2$ gas, the metal films 530 and 540 are exposed to a plasma generated from a single gas of Ar gas.

Note that in the example of FIG. 9, the cleaning process using the $H_2$ gas plasma and the cleaning process using the Ar gas plasma were each performed once after repeating the ALE process 16 times. However, embodiments of the present invention are not limited to the above example. For example, after repeating the ALE process a plurality of times, the cleaning process using the $H_2$ gas plasma may be performed once or repeated a plurality of times, and thereafter, the cleaning process using the Ar gas plasma may be performed once or repeated a plurality of times. Also, in the case where the first process step in the ALE process is repeatedly executed, the second process step may be executed instead of the first process step at least once at the execution timing of the first process step, and in the second process step, the metal films 530 and 540 may be alternately exposed to the plasma generated from a single gas of $H_2$ gas and the plasma generated from a single gas of Ar gas, for example.

In the above-described ALE process and the cleaning process, radio frequency power is applied to at least one of the upper electrode and the lower electrode to generate plasma. In a preferred embodiment, the radio frequency power applied in the Ar gas plasma process step of the ALE process corresponding to the first process step is controlled to be weaker than the radio frequency power applied in the Ar gas plasma process step of the cleaning process corresponding to the second process step. This is because in the first process step, Cl remains on the surface layer of the metal films, and as such, a weaker plasma is preferably generated in order to prevent ionization of the Cl on the metal film surface layers. On the other hand, in the second process step, Cl does not remain on the surface layers of the metal films, and as such, a stronger plasma is preferably generated using radio frequency power that is higher than that applied in the first process step so that the cleaning process can be performed efficiently.

[Metal Oxide Film Removing Apparatus According to Modified Example]

Figure 12:
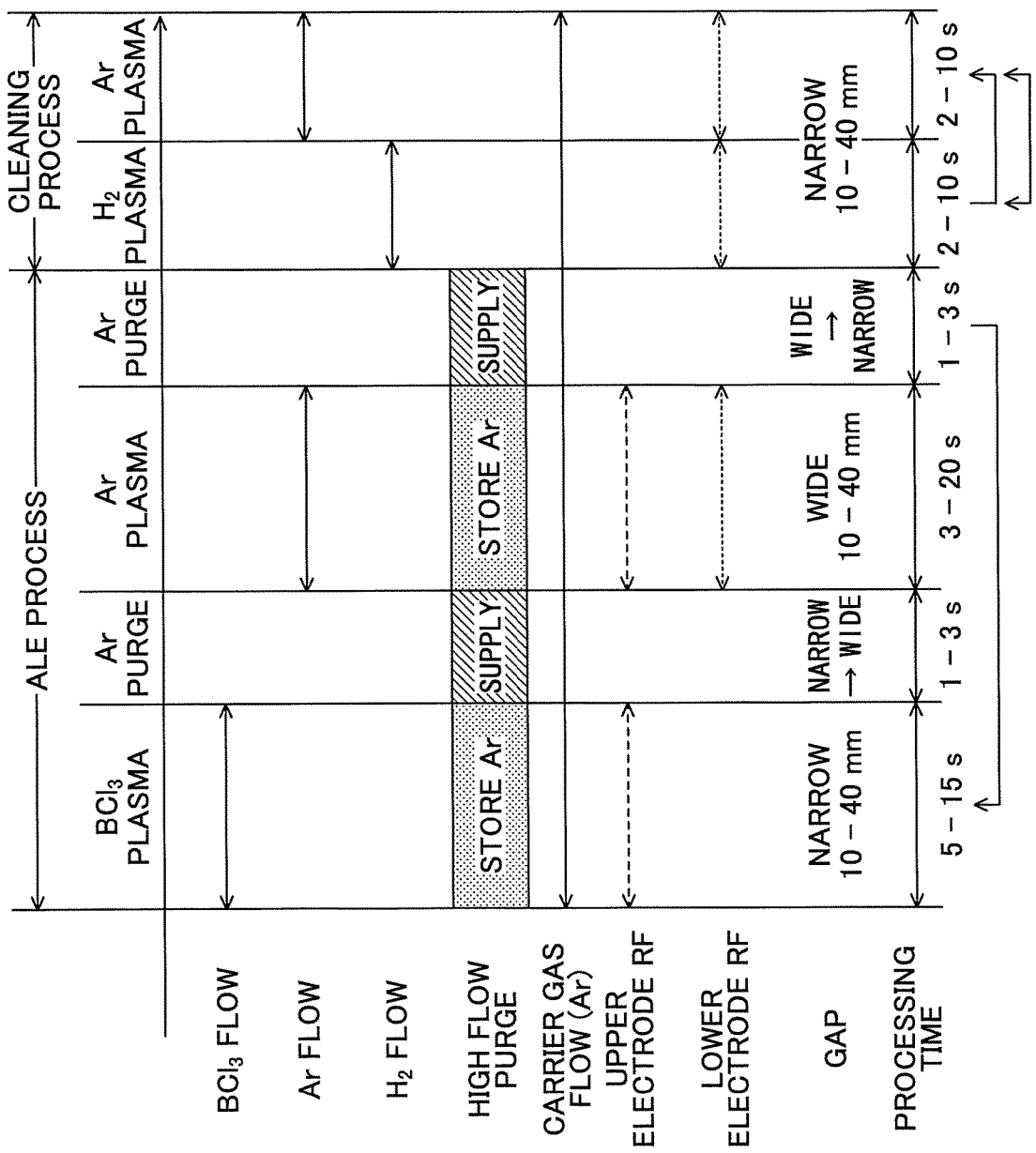
FIG. 12 is a timing chart showing an example selective removal process (including a cleaning process) for removing a plurality of metal oxide films according to the modified embodiment.

In the following, the metal oxide film removing apparatus 100 according to a modified example of the above-described embodiment and a method for controlling the above-described process steps of the selective removal process according to the modified example will be described with reference to FIGS. 11 and 12. FIG. 11 is a diagram showing the metal oxide film removing apparatus 100 according to the modified example. FIG. 12 is a timing chart showing the selective removal process according to the modified example.

Note that the metal oxide film removing apparatus 100 according to the modified example as shown in FIG. 11 has a gas supply mechanism 5 that differs from the gas supply mechanism 5 of the metal oxide film removing apparatus 100 as shown in FIG. 2. The following descriptions focus on the differing features of the gas supply mechanism 5 of the metal oxide film removing apparatus 100 according to the modified example, and descriptions of other features that are substantially identical to those of the metal oxide film removing apparatus 100 of FIG. 2 are omitted.

The gas supply mechanism 5 supplies processing gas into the processing chamber 1. The gas supply mechanism 5 includes the $BCl_3$ gas supply source 51a, the Ar gas supply source 52a, the Ar gas supply source 53a, the $H_2$ gas supply source 54a, an Ar gas supply source 55a, the Ar gas supply source 56a, and an Ar gas supply source 57a.

The $BCl_3$ gas supply source 51a supplies $BCl_3$ gas into the processing chamber 1 via the gas supply line 51b. The gas supply line 51b has the flow rate controller 51c, the storage tank 51d, and the valve 51e arranged from the upstream side to the downstream side of the gas supply line 51b. The downstream side of the valve 51e of the gas supply line 51b is connected to the gas inlet hole 36. The $BCl_3$ gas supplied from the $BCl_3$ gas supply source 51a is temporarily stored in the storage tank 51d before being supplied into the processing chamber 1. The $BCl_3$ gas is pressurized to a predetermined pressure in the storage tank 51d and then supplied into the processing chamber 1. By temporarily storing the $BCl_3$ gas in the storage tank 51d in the above-described manner, the $BCl_3$ gas can be stably supplied into the processing chamber 1 at a relatively high flow rate. The valve 51e allows/stops the supply of $BCl_3$ gas from the $BCl_3$ gas supply source 51a to the processing chamber 1.

The Ar gas supply source 52a supplies Ar gas into the processing chamber 1 via the gas supply lines 52b and 54b. The gas supply line 52b has the flow rate controller 52c, the storage tank 52d, and the valve 52e arranged from the upstream side to the downstream side of the gas supply line 52b. The downstream side of the valve 52e of the gas supply line 52b is connected to the gas supply line 54b. The Ar gas supplied from the Ar gas supply source 52a is temporarily stored in the storage tank 52d before being supplied into the processing chamber 1. The Ar gas is pressurized to a predetermined pressure in the storage tank 52d and then supplied into the processing chamber 1. By temporarily storing the Ar gas in the storage tank 52d in the above-described manner, the Ar gas can be stably supplied into the processing chamber 1 at a relatively high flow rate. The valve 52a allows/stops the supply of Ar gas from the storage tank 52d to the processing chamber 1.

The Ar gas supply source 57a supplies Ar gas into the processing chamber 1 via a gas supply line 57b and the gas supply line 51b. The gas supply line 57b has a flow rate controller 57c, a storage tank 57d, and a valve 57e arranged from the upstream side to the downstream side of the gas supply line 57b. The downstream side of the valve 57e of the gas supply line 57b is connected to the gas supply line 51b. The Ar gas supplied from the Ar gas supply source 57a is temporarily stored in the storage tank 57d before being supplied into the processing chamber 1. The Ar gas is pressurized to a predetermined pressure in the storage tank 57d and then supplied into the processing chamber 1. By temporarily storing the Ar gas in the storage tank 57d in the above-described manner, the Ar gas can be stably supplied into the processing chamber 1 at a relatively high flow rate. The valve 57a allows/stops the supply of Ar gas from the storage tank 57d to the processing chamber 1.

The Ar gas supply source 53a supplies Ar gas, which is used as a carrier gas and a purge gas, into the processing chamber 1 via the gas supply line 53b at all times during processing. The gas supply line 53b has the flow rate controller 53c, the valve 53e, and the orifice 53f arranged from the upstream side to the downstream side of the gas supply line 53b. The downstream side of the orifice 53f of the gas supply line 53b is connected to the gas supply line 51b. The valve 53e allow/stops the supply of Ar gas from the Ar gas supply source 53a to the processing chamber 1. Note that while the storage tanks 51d and 57d enable gas to be supplied at a relatively high flow rate into the gas supply lines 51b and 57b, the orifice 53f prevents the gas supplied to the gas supply lines 51b and 57b from flowing backward and entering the Ar gas supply line 53b.

The $H_2$ gas supply source 54a supplies $H_2$ gas into the processing chamber 1 via the gas supply line 54b. The gas supply line 54b has the flow rate controller 54c, the storage tank 54d, and the valve 54e arranged from the upstream side to the downstream side of the gas supply line 54b. The downstream side of the valve 54e of the gas supply line 54b is connected to the gas inlet hole 37. The $H_2$ gas supplied from the $H_2$ gas supply source 54a is temporarily stored in the storage tank 54d before being supplied into the processing chamber 1. The $H_2$ gas is pressurized to a predetermined pressure in the storage tank 54d and then supplied into the processing chamber 1. By temporarily storing the $H_2$ gas in the storage tank 54d in the above-described manner, the $H_2$ gas can be stably supplied into the processing chamber 1 at a relatively high flow rate. The valve 54e allows/stops the supply of H₂ gas from the H₂ gas supply source 54a to the processing chamber 1.

The Ar gas supply source 55a supplies Ar gas into the processing chamber 1 via a gas supply line 55b and the gas supply line 54b. The gas supply line 55b has a flow rate controller 55c, a storage tank 55d, and a valve 55e arranged from the upstream side to the downstream side of the gas supply line 55b. The downstream side of the valve 55e of the gas supply line 55b is connected to the gas supply line 54b. The Ar gas supplied from the Ar gas supply source 55a is temporarily stored in the storage tank 55d before being supplied into the processing chamber 1. The Ar gas is pressurized to a predetermined pressure in the storage tank 55d and then supplied into the processing chamber 1. By temporarily storing the Ar gas in the storage tank 55d in the above-described manner, the Ar gas can be stably supplied into the processing chamber 1 at a relatively high flow rate. The valve 55e allows/stops the supply of Ar gas from the storage tank 55d to the processing chamber 1.

The Ar gas supply source 56a supplies Ar gas, which is used as a carrier gas and a purge gas, into the processing chamber 1 via the gas supply line 56b at all times during processing. The gas supply line 56b has the flow rate controller 56c, the valve 56e, and the orifice 56f arranged from the upstream side to the downstream side of the gas supply line 56b. The downstream side of the orifice 56f of the gas supply line 56b is connected to the gas supply line 54b. The valve 56e allows/stops the supply of Ar gas from the Ar gas supply source 56a to the processing chamber 1. While the storage tanks 52d, 54d, and 55d enable gas to be supplied at a relatively high flow rate into the gas supply lines 52b, 54b, and 55b, the orifice 56f prevents the gas supplied into the gas supply lines from flowing backward and entering the Ar gas supply line 56b.

Ar gas is supplied as a purge gas from the Ar gas supply sources 53a, 55a, 56a, and 57a into the processing chamber 1 via the gas supply lines 51b, 53b, 54b, 55b, 56b, and 57b. The Ar gas is supplied to purge not only the BCl₃ gas and H₂ gas remaining in the processing chamber 1 but also the BCl₃ gas remaining in the gas supply line 51b at the downstream side of the valve 51e and the H₂ gas remaining in the gas supply line 54b at the downstream side of the valve 54e.

As shown in FIG. 12 (see "HIGH FLOW PURGE"), in the present modified example, a control is implemented to stably supply Ar gas into the processing chamber 1 at a relatively high flow rate. Note that other aspects of the process steps according to the present modified example may be substantially the same as those of the process steps shown in FIG. 5. As such, the following descriptions focus on the control for stably supplying Ar gas into the processing chamber 1 at a relatively high flow rate as represented by "HIGH FLOW PURGE" in FIG. 12, and descriptions of other process steps will be omitted.

According to the "HIGH FLOW PURGE" control of the present modified example, in the BCl₃ gas plasma process step of the ALE process, the valves 55e and 57e of FIG. 11 are closed, and Ar gas from the Ar gas supply sources 55a and 57a are temporarily stored in the storage tanks 55d and 57d (see "STORE Ar" in FIG. 12). Then, in the subsequent Ar gas purge step, the valves 55e and 57e are opened, and the Ar gas stored in the storage tanks 55d and 57d are supplied into the processing chamber 1 (see "SUPPLY" in FIG. 12). By temporarily storing the Ar gas in the storage tanks 55d and 57d in the above-described manner, Ar gas can be stably supplied into the processing chamber 1 at a relatively high flow rate in the Ar gas purge process step.

Then, in the subsequent Ar gas plasma process step, the valves 55e and 57e are closed, and Ar gas from the Ar gas supply sources 55a and 57a are temporarily stored in the storage tanks 55d and 57d (see "STORE Ar" in FIG. 12). Then, in the Ar gas purge process step after the Ar gas plasma process step, the valves 55e and 57e are opened, and the Ar gas stored in the storage tanks 55d and 57d are supplied into the processing chamber 1. By temporarily storing the Ar gas in the storage tanks 55d and 57d in the above-described manner, Ar gas can be stably supplied into the processing chamber 1 at a relatively high flow rate in the Ar gas purge process step (see "SUPPLY" in FIG. 12).

As described above, the present modified example takes into account the importance of efficiently switching gases between process steps in performing selective etching through plasma processing using a plurality of types of single gases (BCl₃, Ar) and performs efficient gas switching. As an example of a gas switching method, an Ar purge gas may be introduced from the gas supply lines 55b and 57b at a relatively high flow rate to inject gas having a high supply pressure into the processing chamber 1. In this way, unreacted components of BCl₃ gas or desorbed B components and Cl components can be completely removed and the natural oxide films 550a and 550b can be etched in a shorter period of time.

[Metal Oxide Film Removing Process, Metal Barrier Film Forming Process and Metal Wire Forming Process]

Figure 13:
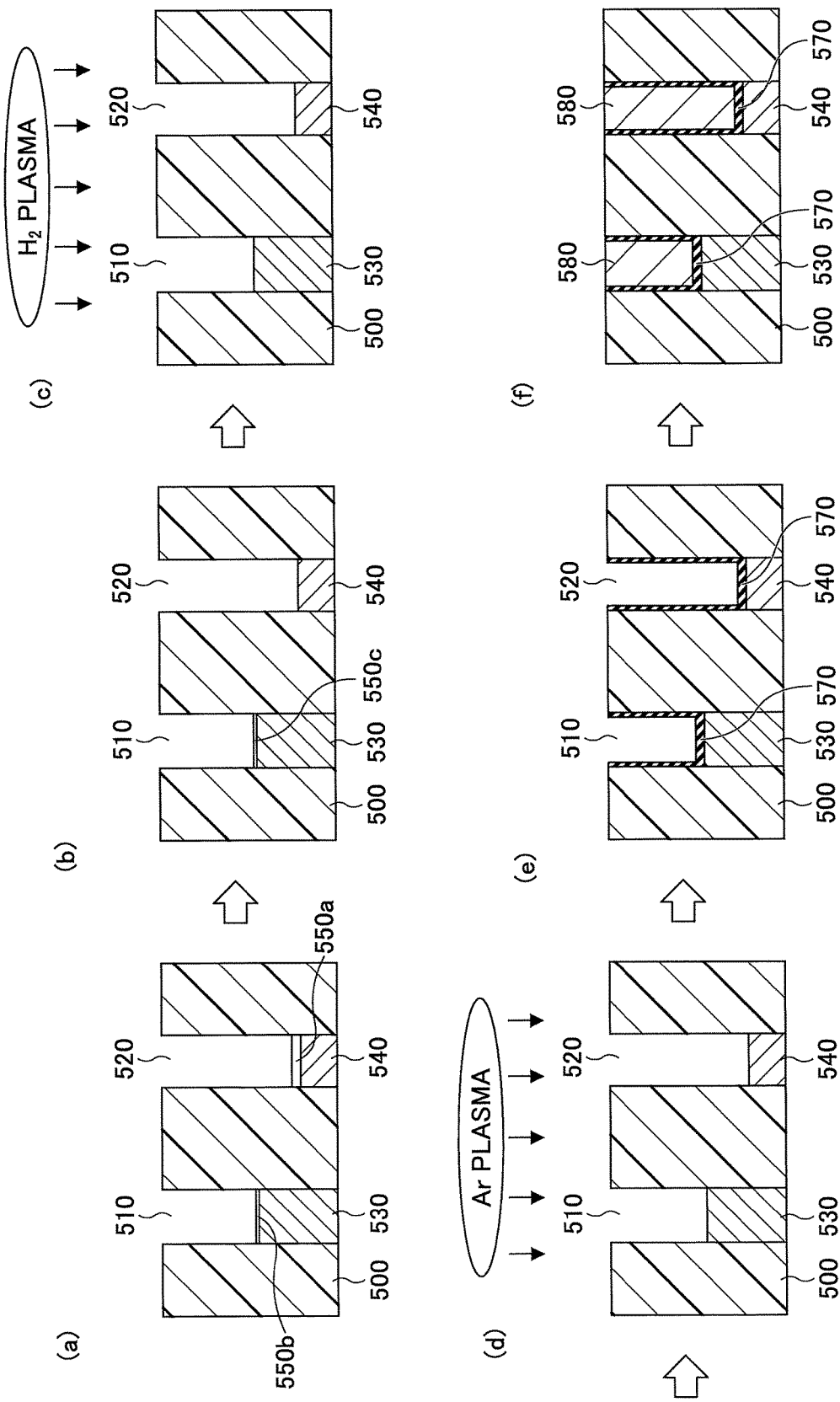
FIG. 13 is a diagram showing example process steps from selectively removing a plurality of types of metal oxide films to embedding a metal wiring according to an embodiment of the present invention.

In the following, a series of processes including a metal oxide film removal process, a metal barrier film forming process, and a metal wiring forming process performed by the metal wiring forming system 300 as shown in FIG. 1 will be described with reference to FIG. 13. FIG. 13 is a diagram showing an example series of process steps from selective removal of a plurality of natural oxide films corresponding to a plurality of types of metal oxide films to embedding a metal wiring according to the present embodiment.

Referring to FIG. 13(a), via holes 510 and 520 as an example of a plurality of recesses are formed in the silicon oxide film 500 formed on the wafer. Metal films in the via holes 510 and 520 may respectively correspond to the metal film 530 and the metal film 540, for example.

The natural oxide films 550a and 550b on the surface layers of the metal films 530 and 540 are removed by performing an ALE process using BCl₃ gas plasma and Ar gas plasma on the natural oxide films 550a and 550b. The cycle of the ALE process (supplying BCl₃ gas or BCl₃ plasma→purge→etching with Ar gas plasma→purge) is repeated a plurality of times.

As a result, in the ALE process, the natural oxide film 550a on the metal film 540 that can easily form a natural oxide film on its surface layer is selectively etched over the natural oxide film 550b on the metal film 530 that cannot easily form a natural oxide film on its surface layer (FIG. 13(b)).

After the ALE process, metal films 530 and 540 are exposed to a plasma generated from a single gas of hydrogen (H₂) gas (FIG. 13(c)), and then, the metal films 530 and 540 are exposed to a plasma generated from a single gas of Ar gas (FIG. 13(d)). In this way, Cl and B on the surface layers of the metal films 530 and 540 can be removed.

Then, a metal barrier film 570 that may be made of tantalum nitride (TaN), for example, is formed on the metal films 530 and 540 in the via holes 510 and 520 by an ALD process of alternately supplying a metal precursor gas and a reaction gas (FIG. 13(e)).

Finally, a metal wiring 580 that may be made of ruthenium (Ru), for example, is embedded on the metal barrier films 570 in the via holes 510 and 520 by a CVD process (FIG. 13(*f*)).

According to an aspect of the present embodiment, the natural oxide films 550*a* and 550*b* are removed by the ALE process before the metal barrier film 570 is formed, and in this way, contact resistance between the metal films 530 and 540 corresponding to base layers and the metal barrier film 570 and the metal wiring 580 that are subsequently formed on these base layers can be reduced.

As described above, by implementing the removal method for selectively removing natural oxide films and the processing method for embedding a wiring according to the present embodiment, a plurality of types of natural oxide films can be selectively removed. Also, by implementing the cleaning process according to the present embodiment, Cl and B residues on the metal films can be removed. In this way, contact resistance between a metal wiring layer and a metal film corresponding to the underlying base layer may be reduced.

Note that although a process step using $BCl_3$ gas plasma is implemented in the ALE process according to the above-described embodiment and the modified example, in other embodiments, a process step of supplying $BCl_3$ gas and promoting adsorption of the $BCl_3$ gas to the metal films 530 and 540 may be implemented instead of using the $BCl_3$ gas plasma generated from $BCl_3$ gas, for example.

Although a removal method for selectively removing a plurality of types of natural oxide films and a processing method for embedding a metal wiring have been described above with respect to certain illustrative embodiments and examples, the removal method and the processing method are not limited to the above-described embodiments and various modifications and changes may be made without departing from the scope of the present invention. Also, aspects of the above-described embodiments and examples can be combined to the extent practicable.

Also, although the wafer W is described as an example of a substrate to be processed, the substrate to be processed is not limited to the wafer W and may be various other types of substrates, such as a substrate used for a LCD (Liquid Crystal Display) or a FPD (Flat Panel Display), a CD substrate, a printed board, and the like.

According to an aspect of the present embodiment, a plurality of types of metal oxide films can be selectively removed.

What is claimed is:

1. A removal method for selectively removing a plurality of types of metal oxide films in a plurality of recesses formed in a substrate that is arranged in a processing chamber, the removal method comprising process steps of: exposing the plurality of types of metal oxide films to BCl3 gas or a BCl3 gas plasma generated by introducing BCl3 gas; stopping introduction of the BCl3 gas and performing a purge process; exposing the plurality of types of metal oxide films and a plurality of types of metal films underneath the plurality of types of metal oxide films to a plasma generated by introducing an inert gas; and stopping introduction of the inert gas and performing the purge process; wherein the process steps are repeated a plurality of times; and wherein the process step of exposing the plurality of types of metal oxide films and the plurality of types of metal films underneath the plurality of types of metal oxide films to the plasma includes performing a first process step of exposing the plurality of types of metal oxide films to one plasma generated from a single gas of the inert gas, and a second process step of exposing the plurality of types of metal films to two different plasmas each generated from a single gas selected from a plurality of types of gases including the inert gas.

2. The removal method according to claim 1, wherein the first process step uses Ar gas or N2 gas as the single gas; and the second process step uses H2 gas and Ar gas as the single gas.

3. The removal method according to claim 2, wherein the second process step includes exposing the plurality of types of metal films to the plasma generated from the single gas of $H_2$ gas and then exposing the plurality of types of metal films to the plasma generated from the single gas of Ar gas.

4. The removal method according to claim 2, wherein the second process step includes alternately exposing the plurality of types of metal films to the plasma generated from the single gas of $H_2$ gas and the plasma generated from the single gas of Ar gas.

5. The removal method according to claim 2, wherein the second process step includes intermittently applying the plasma generated from the single gas of H2 gas and the plasma generated from the single gas of Ar gas.

6. The removal method according to claim 2, further comprising:
 storing Ar gas in a storage tank in each of the process steps preceding the process step of stopping introduction of the $BCl_3$ gas and performing the purge process and the process step of stopping introduction of the inert gas and performing the purge process; and
 supplying the stored Ar gas in the process step of stopping introduction of the $BCl_3$ gas and performing the purge process and the process step of stopping introduction of the inert gas and performing the purge process.

7. The removal method according to claim 1, wherein the first process step includes applying a first radio frequency power to an upper electrode and a lower electrode; and the second process step includes applying a second radio frequency power to the lower electrode.

8. The removal method according to claim 7, wherein the first radio frequency power applied in the first process step is weaker than the second radio frequency power applied in the second process step.

9. The removal method according to claim 1, wherein the process step of exposing the plurality of types of metal oxide films to the $BCl_3$ gas plasma generated by introducing $BCl_3$ gas includes applying a radio frequency power to an upper electrode.

10. The removal method according to claim 1, further comprising: adjusting a gap between a lower electrode and an upper electrode opposing the lower electrode using an adjustment mechanism for adjusting a height of the lower electrode that corresponds to a pedestal on which the substrate is placed.

11. The removal method according to claim 10, wherein the height of the lower electrode is adjusted by the adjustment mechanism during the process step of stopping introduction of the $BCl_3$ gas and performing the purge process and the process step of stopping introduction of the inert gas and performing the purge process.

12. The removal method according to claim 10, wherein the height of the lower electrode is adjusted by the adjustment mechanism such that the gap between the upper electrode and the lower electrode during the first process step is wider than the gap during the second process step.

13. A processing method for embedding a metal wiring in a recess, the processing method comprising steps of: selectively removing a plurality of types of metal oxide films in a plurality of recesses formed in a substrate that is arranged in a processing chamber; selectively removing the plurality of types of metal oxide films and then covering the plurality of recesses with a metal barrier film; and embedding a metal wiring in the plurality of recesses covered by the metal barrier film; wherein all of the steps are performed without exposing the substrate in the processing chamber to the atmosphere; wherein the step of selectively removing the plurality of types of metal oxide films includes a series of process steps to be repeated a plurality of times, the series of process steps including exposing the plurality of types of metal oxide films to BCl3 gas or a BCl3 gas plasma generated by introducing BCl3 gas; stopping introduction of the BCl3 gas and performing a purge process; exposing the plurality of types of metal oxide films and a plurality of types of metal films underneath the plurality of types of metal oxide films to a plasma generated by introducing an inert gas; and stopping introduction of the inert gas and performing the purge process; wherein the process step of exposing the plurality of types of metal oxide films and the plurality of types of metal films underneath the plurality of types of metal oxide films to the plasma includes exposing the plurality of types of metal oxide films and the plurality of types of metal films to one or more different plasma generated from a single gas.

14. The processing method according to claim 13, wherein the metal barrier film covering the plurality of recesses is made of titanium nitride (TiN) or tantalum nitride (TaN).

15. The processing method according to claim 13, wherein the metal wiring embedded in the plurality of recesses is made of ruthenium (Ru).

* * * * *